United States Patent [19]
Lyon et al.

[11] Patent Number: 5,594,175
[45] Date of Patent: Jan. 14, 1997

[54] APPARATUS AND METHOD FOR NON-INVASIVE DIAGNOSIS AND CONTROL OF MOTOR OPERATED VALVE CONDITION

[75] Inventors: Richard H. Lyon, Belmont, Mass.; Jangbom Chai, Seoul, Rep. of Korea; Jeffrey H. Lang, Sudbury, Mass.; Wayne H. Hagman; Stephen D. Umans, both of Belmont, Mass.; Olli J. Saarela, Helsinki, Finland

[73] Assignee: Massachusetts Institute of Technology, Cambridge, Mass.

[21] Appl. No.: 239,073

[22] Filed: May 6, 1994

[51] Int. Cl.[6] ............................................. G01M 13/00
[52] U.S. Cl. .............................. 73/593; 73/658; 73/168
[58] Field of Search .......................... 73/593, 658, 659, 73/660, 168

[56] References Cited

U.S. PATENT DOCUMENTS

| | | | |
|---|---|---|---|
| 4,879,901 | 11/1989 | Leon | 73/168 |
| 5,111,690 | 4/1992 | Duff | 73/168 |
| 5,239,874 | 9/1993 | Hale | 73/862.191 |
| 5,329,465 | 7/1994 | Arcella et al. | 364/570 |
| 5,345,158 | 9/1994 | Kliman et al. | 318/434 |
| 5,396,167 | 3/1995 | Leon | 73/168 |
| 5,419,197 | 5/1995 | Ogi et al. | 73/659 |
| 5,433,245 | 7/1995 | Prather et al. | 137/554 |

OTHER PUBLICATIONS

R. G. Gibson, "Phase Variability of Structural Transfer Function," M.Sc. Thesis, MIT Dept. of Mech. Eng., submitted in Feb. 1986.

J. Kim, "Source and Path Recovery from Vibration Response Monitoring," Ph.D. Thesis, MIT, Dept. of Mech. Eng., submitted in Mar. 1987.

P. Maragos, J. F. Kaiser and T. F. Quatieri, "On Separating Amplitude from Frequency Modulations Using Energy Operators," 1992 International Conference on Acoustic, Speech, and Signal Processing, Mar. 23–26, 1992.

T. A. C. M. Classen and W. F. G. Mecklenbruker, "The Wigner Distribution—A tool for Time–Frequency Signal Analysis, Part I–III," Philips Journal of Research, vol. 35, pp. 217–250, 276–300 and 372–389, 1980.

K. M. Wong and Q. Jin, "Estimation of the Time–Varying Frequency of a Signal: The Cramer–Rao Bound and the Application of Wigner Distribution," IEEE Transactions on Acoustic, Speech, and Signal Processing, vol. 38, No. 3, Mar. 1990.

N. Yen, "Time and frequency representation of acoustic signals by means of the Wigner distribution function: Implementation and interpretation," J. Acoust. Soc. Am. 81 (6), Jun., 1987.

(List continued on next page.)

Primary Examiner—Richard Chilcot
Assistant Examiner—Max Noori
Attorney, Agent, or Firm—Steven J. Weissburg

[57] ABSTRACT

An apparatus compares the torque from an MOV motor with the valve displacement, and from the comparison assesses MOV operating condition. A transducer measures the vibration of the housing of an MOV. The vibrations are due to the motions of the rotating elements within the housing, which motions are directly related to the motion of the valve relative to its seat. Signal processing apparatus analyzes the vibrations to recover the rotations of the rotating elements and thus the motion of the valve plug. Lost motion can also be determined (if a lost motion connection exists) by demodulating the vibration signal and thus taking into account also the lost motion. Simultaneously, the forces applied to the valve are estimated by estimating the torque between the stator and the rotor of the motor. Such torque can be estimated from measuring the input current and voltage alone, using a forgetting factor and a correction for the forgetting factor. A signature derived from relating the torque to the valve position can be used to assess the condition of the MOV, by comparing the signature to signatures for MOVs of known conditions. The vibration analysis components generate signals that relate to the position of elements in the operator. Similarly, the torque estimator estimates the torque output by any type of electric motor, whether or not part of an MOV analysis unit.

80 Claims, 15 Drawing Sheets

OTHER PUBLICATIONS

D. L. Bowen, "Application of Signature Inverse Filtering to the Fault Diagnosis of an Impact Mechanism," M.Sc. Thesis, MIT, Dept. of Mech. Eng., Mar. 1983.

R. E. Powell, "Multichannel Inverse Filtering of Machinery Vibration Signals," D.Sc. Thesis, MIT, Dept. of Mech. Eng., submitted in Sep. 1982.

A. Ordubadi, "Component and Fault Identification in a Machine Structure Using an Acoustic Signal," D.Sc. Thesis, MIT, Dept. of Mech. Eng., submitted in May 1980.

Chai, J., "Non–Invasive Diagnostics of Motor–Operated Valves," submitted in partial fulfillment of the requirements for the degree of Doctor of Philosophy at MIT, submitted in May 7, 1993.

S. L. Marple, Digital Spectral Analsis with Applications, Prentice–Hall, New Jersey (1987).

Declaration of Kent F. Hansen, dated Apr. 24, 1995, with Attachments A, B, C1–C8, and D1–D4.

Hansen Exhibit A: An International Program for Enhanced Nuclear Power Plant Safety, Center for Energy Policy Research, Massachusetts Institute of Technology, Cambridge, MA.

Hansen Exhibit C1: MIT International Program on Enhanced Nuclear Power Safety—Conference, Center for Energy Policy Research, Massachusetts Institute of Technology, Cambridge, MA, Jun. 27–29, 1990.

Hansen Exhibit C2: The MIT International Program on Enhanced Nuclear Power Safety—Progress Report, Center for Energy Policy Research, Massachusetts Institute of Technology, Cambridge, MA, Jan. 1991.

Hansen Exhibit C3: The MIT International Program on Enhanced Nuclear Power Safety—Progress Report, Center for Energy Policy Research, Massachusetts Institute of Technology, Cambridge, MA, Jun. 1991.

Hansen Exhibit C4: The MIT International Program on Enhanced Nuclear Power Safety—Progress Report, Center for Energy Policy Research, Massachusetts Institute of Technology, Cambridge, MA, Jan. 1992.

Hansen Exhibit C5: The MIT International Program on Enhanced Nuclear Power Safety—Progress Report, Center for Energy Policy Research, Massachusetts Institute of Technology, Cambridge, MA, Jun. 1992.

Hansen Exhibit C6: The MIT International Program on Enhanced Nuclear Power Safety—Progress Report, Center for Energy Policy Research, Massachusetts Institute of Technology, Cambridge, MA, Jan. 1993.

Hansen Exhibit C7: The MIT International Program on Enhanced Nuclear Power Safety—Progress Report, Center for Energy Policy Research, Massachusetts Institute of Technology, Cambridge, MA, Jun. 1993.

Hansen Exhibit C8: The MIT International Program on Enhanced Nuclear Power Safety—Progress Report, Center for Energy Policy Research, Massachusetts Institute of Technology, Cambridge, MA, Jan. 1994.

Hansen Exhibit D1: e–lab, Current research at the Energy Laboratory, Massachusetts Institute of Technology, Cambridge, MA, Jan.–Jun. 1991.

Hansen Exhibit D2: e–lab, Current research at the Energy Laboratory, Massachusetts Institute of Technology, Cambridge, MA, Jul.–Sep. 1991.

Hansen Exhibit D3: e–lab, Current research at the Energy Laboratory, Massachusetts Institute of Technology, Cambridge, MA, Jan.–Mar. 1993.

Hansen Exhibit D4: e–lab, Current research at the Energy Laboratory, Massachusetts Institute of Technology, Cambridge, MA, Apr.–Sep. 1993.

APPARATUS AND METHOD FOR NON-INVASIVE DIAGNOSIS AND CONTROL OF MOTOR OPERATED VALVE CONDITION

GOVERNMENT RIGHTS

This invention was developed under subcontract with Los Alamos National Laboratory. The U.S. Government has certain rights in this invention pursuant to Contract No. W-7405-ENG-36, awarded by the Department of Energy, to the University of California.

BACKGROUND

This invention relates to the field of on-line monitoring and diagnosis of motor-operated valves ("MOVs"). The invention further relates to mechanical and electrical measurements and signal processing.

Motor-operated valves are widely used in industry to control fluid-circulating systems for both liquids and gasses. In nuclear power plants, these fluid-circulating systems are especially crucial for safety, and a loss of control of these systems can have catastrophic consequences. Therefore, particular concern is placed on the reliability of MOVs. MOVs often operate in harsh environments and, consequently, they are subject to wear and prone to failure. The harsh operational environments make it difficult to monitor their operation in order to detect and diagnose failures at an incipient stage. The Nuclear Regulatory Commission ("NRC") has mandated that nuclear plants conduct a rigorous testing program on MOVs. Appropriate tests may range from daily operational checks to periodic testing. In the latter, the valve is heavily instrumented and forced to operate under emergency, steady-state and transient conditions. While these tests are extensive and provide much information concerning the operation of MOVs, they all suffer from the same drawback. They yield failure information after a failure has occurred, but do not predict future failures. Also to carry out these tests is very expensive.

Many efforts have been made to analyze MOV failure modes and to develop monitoring schemes that will generate information concerning the operation of MOVs. These schemes generally involve recognition of failure patterns in motor current and mechanical loading signatures using strain gages. Typically, the strain gauges are mounted on the valve stem or plug. See generally, H. D. Haynes and R. C. Kryter, "Condition Monitoring of Machinery Using Motor Current Signature Analysis", Oak Ridge National Laboratory; G. B. Kliman and J. Stein, "Induction Motor Fault Detection Via Passive Current Monitoring—A Brief Survey", Current Practices and Trends in Mechanical Failure Prevention—Proceedings of the 44th Meeting of the Mechanical Failure Prevention Group of the Vibration Institute, pp. 97–109, Virginia Beach, Va., 3–5 Apr. 1990; and S. Salter, "Valve Diagnostic Using Stem Load Measurements", Proceedings of the Institution of Mechanical Engineers International Conference on Valves for Power Plant Development and Testing, pp. 131–137, University of Southampton, 4–6 Apr. 1989. Several such systems have been marketed, meeting with varying degrees of commercial success. The existing systems and techniques do not fulfill all of the industry needs. Nuclear utilities and equipment vendors have pointed to opportunities for improvement in the area of fault detection and diagnosis in MOV systems.

MOVs are also used extensively in chemical manufacturing and in manufacturing processes where chemicals are used. Although these industries need not comply with NRC regulations they rely on the MOVs to properly regulate operations. Therefore there is also a need for evaluation of the operational integrity of MOVs in non-nuclear industries.

FIGS. 2 and 3 show a typical MOV in a schematic diagram and an exploded view, respectively. The figures show a model SMB-000, available from Limitorque, Inc. of Lynchburg, Va., which is of a typical design. A preferred embodiment of the invention will be discussed below in connection with such a typical MOV used in nuclear facilities. However, it will be understood that the invention may also be used with MOVs used in chemical processing situations, as well as with MOVs that are not configured the same as the MOV discussed.

A valve 201, consisting of a stem 224, a seat 203 and a plug 202 is driven by a motor 204, which is bolted to the actuator gear box or housing (not shown). The gear train between the output of the motor shaft 212 and the valve stem nut 220 is typically referred to as an operator, or an actuator. A pinion gear 206, which is attached to the motor shaft 212, drives a helical gear 207. The helical gear 207 drives a worm 210 that is connected to the splined, opposite end of the worm shaft 214.

This worm 210 is capable of moving axially as it rotates with the worm shaft 214. The axial movement of the worm is a means of controlling the torque that is applied to the valve stem nut 220. The worm 210 drives a lugged worm gear 216, which rotates the drive assembly 218. (The worm is a generally elongated gear apparatus. The worm gear 216 rotates about an axis that is perpendicular to the long axis of the worm (about which the worm rotates), and generally meshes with a portion of the length of the worm. The two are distinct.)

As the drive sleeve 222 rotates, the stem nut 220 raises or lowers a valve stem 224, which is connected to the stem nut through threads. When resistance arises to rotation of the worm gear 216, (because the valve plug 202 is beginning to seat or become obstructed), the worm 216 then begins to slide axially along its splined shaft 214, compressing a spring pack 226. (The worm 210 begins to slide before the worm gear 216 comes to a full stop.) This axial movement operates a torque limit switch 228 connected through leads 230 to a control circuit (not shown), causing the motor 204 to be de-energized when the spring pack is compressed to a preselected amount.

When the motor 204 is reversed, the worm gear 216 rotates approximately 130 degrees until its worm gear lugs 304 (FIG. 3) engage the drive sleeve 222. This motion, which is referred to as the "lost motion," allows the motor 204 to build up speed under no load conditions prior to engaging the drive sleeve 222. The engagement of the drive sleeve 222 in this fashion is rather abrupt and gives rise to what is referred to as a "hammer-blow effect".

The torque switch 228 measures the axial compression of the spring pack 226. Since the spring pack compression force is proportional to the worm thrust, the axial compression of the spring pack is a direct measure of the MOV output torque and an indirect measure of the MOV output thrust applied to the valve 202. Problems often arise with establishing and maintaining the proper setting of this torque switch.

There are normally two different switches that control an MOV: the torque switch and a geared travel limit switch 234. The geared travel limit switch assembly is driven directly by the operator gear train 208 and can be adjusted to operate at any point along the valve stroke. On a typical rising stem valve, the geared travel limit switch is used to de-energize the motor when the valve reaches its open position, prior to contacting the valve back seat. It is also difficult to establish and maintain the proper settings for this geared travel limit switch. As is mentioned above, MOV's also include an electric motor. For many reasons, it is useful to know the torque output by the motor. It is typically not possible to measure this torque without disrupting the normal operation of the MOV and motor.

OBJECTS OF THE INVENTION

An object of the invention is reducing MOV maintenance and outage costs, and increasing safety through the early detection and diagnosis of incipient faults of MOVs. It is also an object of the invention to predict failures by monitoring MOVs as they work. Another object of the invention is to reduce costs by eliminating the need for extensive surveillance tests. Another object of the invention is to develop a reliable diagnostic system and prognostic methods. Another goal of the invention is to develop a diagnostic system for MOVs that is non-invasive, and hence capable of retrofit operation. It is also an object of the invention to provide a non-invasive apparatus to replace the torque limit switch and the geared travel limit switch that are normally part of the MOV control apparatus, and which often cause problems. Another object of the invention is to provide data that can be used to calibrate the spring pack constant of an MOV under test. Another object of the invention is to generate a set of characteristic signatures, relating the output torque of the motor of an MOV to the position of the valve, for different MOV operating conditions. Still another object of the invention is to generate a set of characteristic signatures, relating the output torque of the motor of an MOV to the compression position of the spring pack, also for different MOV operating conditions. An additional object of the invention is to measure or estimate the torque output by the electric motor non-invasively, without disrupting the normal operation of the MOV.

SUMMARY

In general, preferred embodiments of the invention are included in an apparatus that measures the vibration of the housing of an MOV. The vibrations are due to the motions of the rotating elements within the housing, which motions are directly related to the motion of the valve relative to its seat. Signal processing apparatus analyzes the vibrations to recover the rotations of the rotating elements and thus the motion of the valve. If there is a lost motion connection within the gear train of the MOV operator, which is typical, the lost motion can also be determined by demodulating the vibration signal and thus taking into account also the lost motion. Simultaneously, the forces applied to the valve can be estimated by estimating the torque between the stator and the rotor of the motor. Such torque can be estimated from measuring the input current and voltage alone, using a forgetting factor and a correction for the forgetting factor. A signature derived from relating the torque to the valve position can be used to assess the condition of the MOV, by comparing the signature to signatures for MOVs of known conditions.

Individual elements of the invention are also useful apart from the entire apparatus. Thus, the vibration analysis components can be used to generate signals that relate to the position of elements in the operator. Similarly, the torque estimator can be used for estimating the torque output by any type of electric motor, whether or not part of an MOV analysis unit.

More specifically, a preferred embodiment of the invention is an apparatus for generating a parametric signature signal that corresponds to an operational aspect of an MOV. The MOV has an electric motor and a housing which contains a first gear pair having a first gear and a second gear, the first gear being coupled to the motor output shaft. The MOV also has a valve plug that is coupled to the second gear and that is movable, relative to a valve seat, in response to rotation of the output shaft. The signature signal generating apparatus comprises: a. vibrationally coupled with the housing, a vibrations pickup arranged to generate an electromagnetic signal that corresponds to vibration of the housing; b. electromagnetically coupled with the output of the vibration pickup, a vibration analyzer, which generates a position signal that corresponds to an estimate of the position of at least one element of the MOV that is coupled to the first gear, with respect to time; c. a torque estimator, which generates a signal that corresponds to an estimate of the torque between the stator and the rotor of the motor with respect to time; and d. a system analyzer, coupled to the outputs of the torque estimator and the vibration analyzer, which system analyzer generates a signature signal that corresponds to the relation between the motor torque and the at least one MOV element position.

In another preferred embodiment, the MOV element position is the position of the valve plug relative to its seat.

In yet another preferred embodiment, the torque estimator comprises: a voltage meter for generating a signal that corresponds to the motor input voltage, a current meter for generating a signal that corresponds to the motor input current and a torque signal processor, which generates the torque estimate signal.

In a preferred embodiment, the torque signal processor comprises a flux linkage estimator, which generates a signal that corresponds to estimated motor flux linkage based on the motor input voltage and current signals and, coupled to the flux linkage estimator, a torque estimator, which generates the torque estimate signal based on the estimated motor flux linkage signal and a signal that corresponds to a forgetting factor. It may also be beneficial for the torque estimator to further base its output on a signal that corresponds to a correction factor related to the forgetting factor.

According to still another preferred embodiment, the apparatus includes a failure analyzer, coupled to the output of the system analyzer, to compare the signature signal to at least one predetermined signature signals, which predetermined signals correspond to known operating conditions of an MOV.

With still another preferred embodiment, the vibration analyzer comprises a first gear position estimator, which generates a signal that corresponds to an estimate of the rotational position of a gear of the first gear pair (designated the "first gear pair rotational position signal").

Another preferred embodiment is useful with an MOV that also includes: a second gear pair, constituting a third gear and a fourth gear, the third gear being coupled through a lost motion element to the second gear, which lost motion element includes a component that is movable if the torque between the third and fourth gears exceeds a threshold torque; and a spring, that is coupled between the housing and the third gear through the movable lost motion component, the spring being arranged to resist motion of the movable lost motion component. For this embodiment, the at least one MOV element is the spring. The vibration analyzer further comprises a second gear position estimator, which generates a signal that corresponds to an estimate of the rotational position of the fourth gear based on the first gear pair rotational position signal and the system analyzer further comprises a spring displacement estimator, which generates a signal that corresponds to an estimate of the displacement of the spring based on the fourth gear rotational position signal and the first gear rotational position signal.

According to another preferred embodiment, the apparatus further comprises a control signal generator that generates a control signal based on the valve plug position signal or the spring displacement signal or both.

According to still another preferred embodiment, the first gear position estimator includes an FM demodulator. Further the vibration pickup may be an accelerometer or a laser pickup.

According to still another preferred embodiment, the invention is an apparatus for determining an operational aspect of an MOV, as described above without the torque estimator. The operational aspect of the MOV may be the position of the valve plug relative to the valve seat, or the displacement of the spring, or both.

According to another preferred embodiment, the invention is a torque estimator, for estimating the torque between the stator and the rotor of an electric motor. The torque estimator comprises a voltage meter for generating a signal that corresponds to the motor input voltage, a current meter for generating a signal that corresponds to the motor input current and a torque signal processor. The torque signal processor includes a flux linkage estimator, which generates a signal that corresponds to estimated motor flux linkage based on the motor input voltage and current. Coupled to the flux linkage estimator is a torque estimator, which generates the torque estimate signal based on the estimated motor flux linkage signal, a signal that corresponds to a forgetting factor and a signal that corresponds to a correction factor related to the forgetting factor.

Yet another preferred embodiment of the invention is a method for identifying an operational aspect of an MOV. The method is useful for an MOV that has an electric motor and a housing. Within the housing is a first gear pair having a first gear and a second gear, the first gear being coupled to the motor output shaft. The MOV also has a valve plug that is coupled to the second gear and that is movable, relative to a valve seat, in response to rotation of the output shaft. The signature signal generating method comprises the steps of: generating an electromagnetic signal that corresponds to vibration of the housing; generating a position signal that corresponds to an estimate of the position of at least one element of the MOV that is coupled to the first gear, with respect to time; generating a signal that corresponds to an estimate of the torque between the stator and the rotor of the motor with respect to time; and generating a signature signal that corresponds to the relation between the motor torque and the at least one MOV element position.

Yet another preferred embodiment of the invention is a method further comprising the step of comparing the signature signal to at least one predetermined signature signals, which predetermined signals correspond to known operating conditions of an MOV.

Another preferred embodiment of the invention is a method for determining an operational aspect of an MOV, which does not include the steps of estimating the torque of the motor, but does include the steps of determining the position of an element of the MOV, typically either the valve plug or a spring in a lost motion device.

Another preferred embodiment of the invention is a method for estimating the torque between the stator and the rotor of an electric motor, comprising the steps of measuring the voltage and the current input to the motor and generating a torque estimate signal based on the voltage and the current signals and an estimated flux linkage signal and a forgetting factor and a correction factor related to the forgetting factor.

BRIEF DESCRIPTION OF THE DRAWINGS

These and other features, aspects, and advantages of the present invention will become better understood with regard to the following description, appended claims and accompanying drawings, where:

DETAILED DESCRIPTION OF PREFERRED EMBODIMENTS OF THE INVENTION

A preferred embodiment of the present invention compares operating parameters for an MOV, measured during use, with: 1) historical data regarding that particular MOV; and/or 2) with characteristic MOV "signatures" for MOVs in known states of operating conditions. It has been determined that useful information is contained in the shape of the curve (the "signature" or "profile") that relates the output electric torque between the stator and the rotor of an MOV motor on the one hand to the position of the valve along its path of travel from open to closed.

Ideally, one would wish to be able to generate a signature relating the position of the valve to the torque applied between the stem nut 220 and the valve stem 224. However, measuring torque at that point would be very difficult. In a system with no torque losses, the torque between the stator and the rotor is directly related to the torque between the stem nut and the stem. The lossless approximation is appropriate for the MOV situations encountered. Thus, in the invention, motor torque is used as a surrogate for torque between the stem nut and the valve stem. (As is explained below, even the motor torque is not directly measured, but, rather, is estimated using, in a preferred embodiment, the current and voltage supplied to the motor 204. There are also other ways to estimate the motor torque.)

Figure 1:
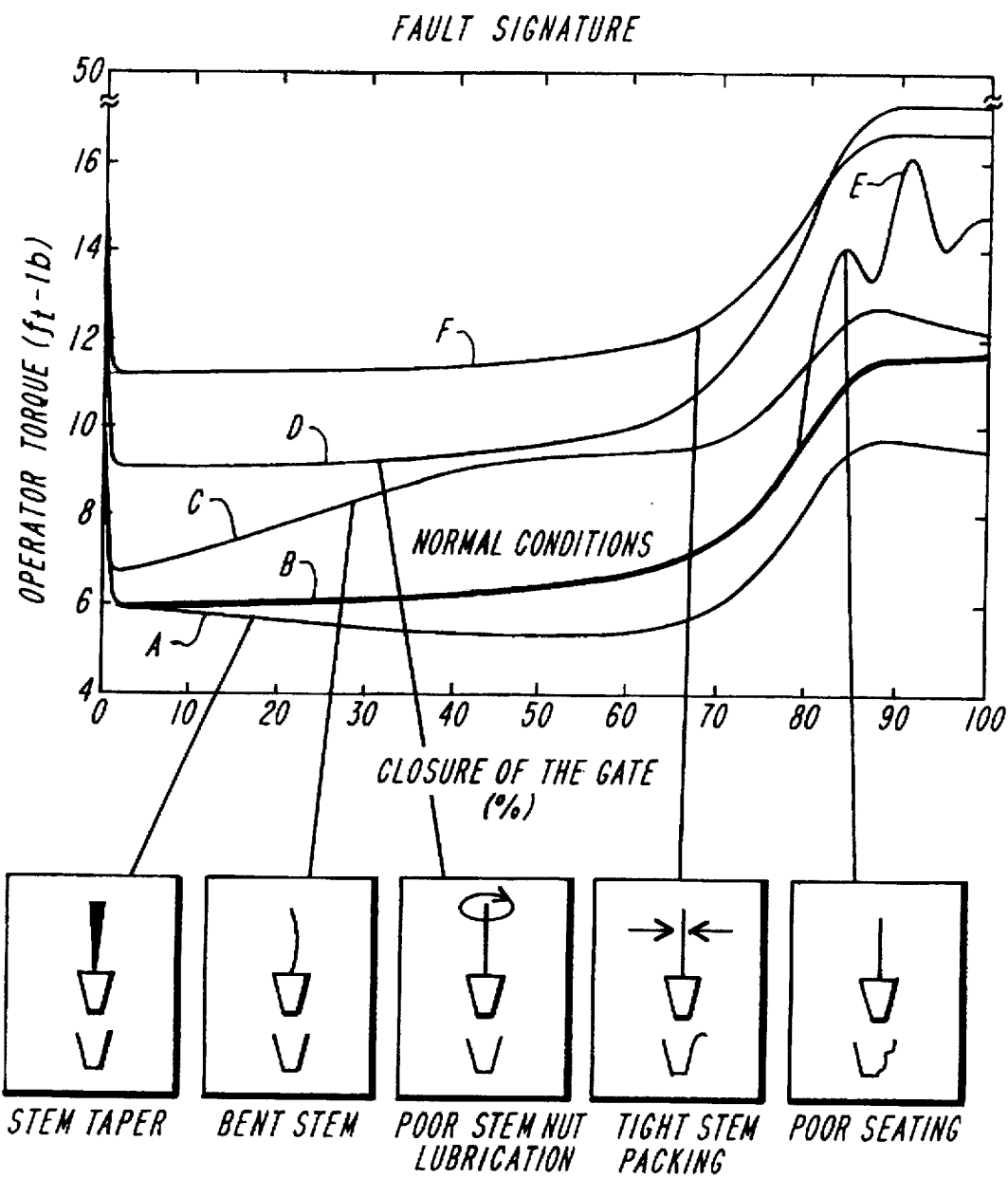
FIG. 1 is a schematic diagram showing a set of "signature curves" relating motor torque to percent closure of the valve for normal operating conditions and several malfunctioning situations.
Figure 2:
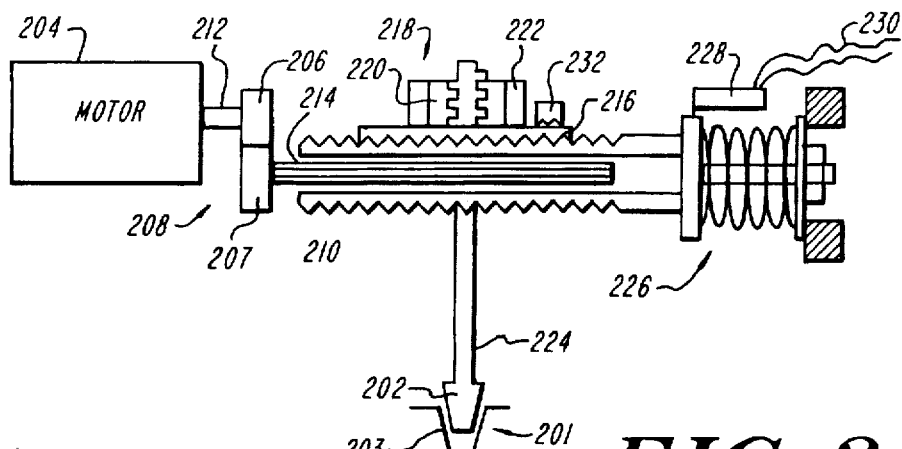
FIG. 2 is a schematic diagram of an MOV with which the invention could be used, such as a Limitorque SMB-000 motor operator.

An example of several such signatures is shown schematically in FIG. 1, which relates the torque of the motor (in ft.-lbs) to the position of the valve, expressed as a percent of closure. Six characteristic curves are shown: improperly tapered stem A; normal conditions B; bent stem C; poor stem nut lubrication D; poor valve seat E and tight stem packing F.

The apparatus of the invention consists generally of components for determining the instantaneous motor torque and the valve position. (These components and activities are discussed in more detail below.) These components must be usable with existing equipment. They should not degrade or interfere with the performance of the MOV.

It is common to activate an MOV at times when there is no emergency situation or operational requirement, to evaluate whether or not the MOV is functioning properly. During these test activations, using the invention, data can be taken to create operating signatures, such as are shown in FIG. 1. These data are compared to signatures previously taken for the same MOV, or to signatures of known conditions for typical MOVs. Based on a comparison between the measured data and the recorded data, it is determined whether the MOV is in an acceptable operating condition or not. It can be seen from FIG. 1 that the curves for the various problem situations catalogued differ significantly from that of the normal conditions, curve B. (A fuller discussion of the features of these curves is set forth below.) In some cases, the reference curves may be based on data taken using instrumentation on the MOVs, which instrumentation would not be acceptable during normal installation. Such instrumentation is mentioned in the following sections, after the basic configuration of the invention is explained.

Typically, the invention will be used as a predicter of incipient operating problems, to identify them before they become a significant problem. (Most facilities are equipped with redundant MOVs, in series or in parallel, depending on the function, so, even if one MOV fails in use, catastrophe can often be averted.) It is also contemplated that the invention may be used to evaluate the performance of an MOV in real time, as it is operating. Thus, the nominally redundant MOV of the pair can be actively activated at an earlier stage in the onset of a problem, as the situation arises. For instance, any one of the anomalous conditions curves A, C, D and F differ significantly from the normal conditions curve B after about 30% of valve closure (with some differing identifiably almost immediately). Use of the invention in such a "real time" or "on the fly" manner requires a significant computational capacity, in terms of both processing speed and memory capacity.

According to a preferred embodiment of the invention, the motor torque, between its stator and rotor, is not measured directly. Rather, it is estimated, using the measured input current and input voltage. Similarly, the position of the valve 201 is not measured directly, as that would impede its operation, or require significant alteration of the basic design of a standard MOV. Rather, the position of the valve is estimated, using measured vibrations of the housing. From the vibrations, information about the motion of the gears that make up the operator can be determined, and from these motions, the position of the valve 201 can be determined.

Rather than using motor torque and percent of closure, other, equivalent parameters may be used, such as valve thrust and valve position, or stem nut force and gear rotations. What is required is a parameter that relates to the forces or torques in the operator gear train, on the one hand, and the location of the valve on the other.

Figure 4:
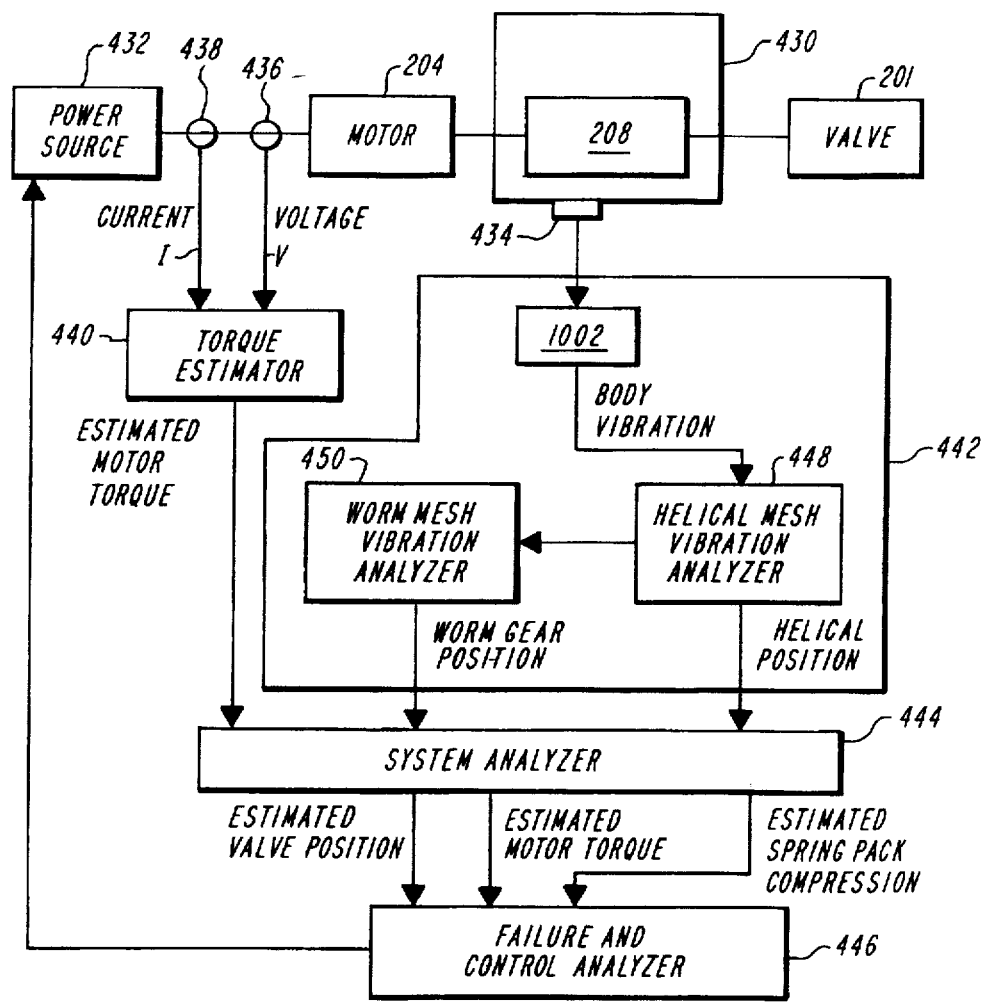
FIG. 4 is a schematic block diagram of a preferred embodiment of the apparatus of the invention.
Figure 3:
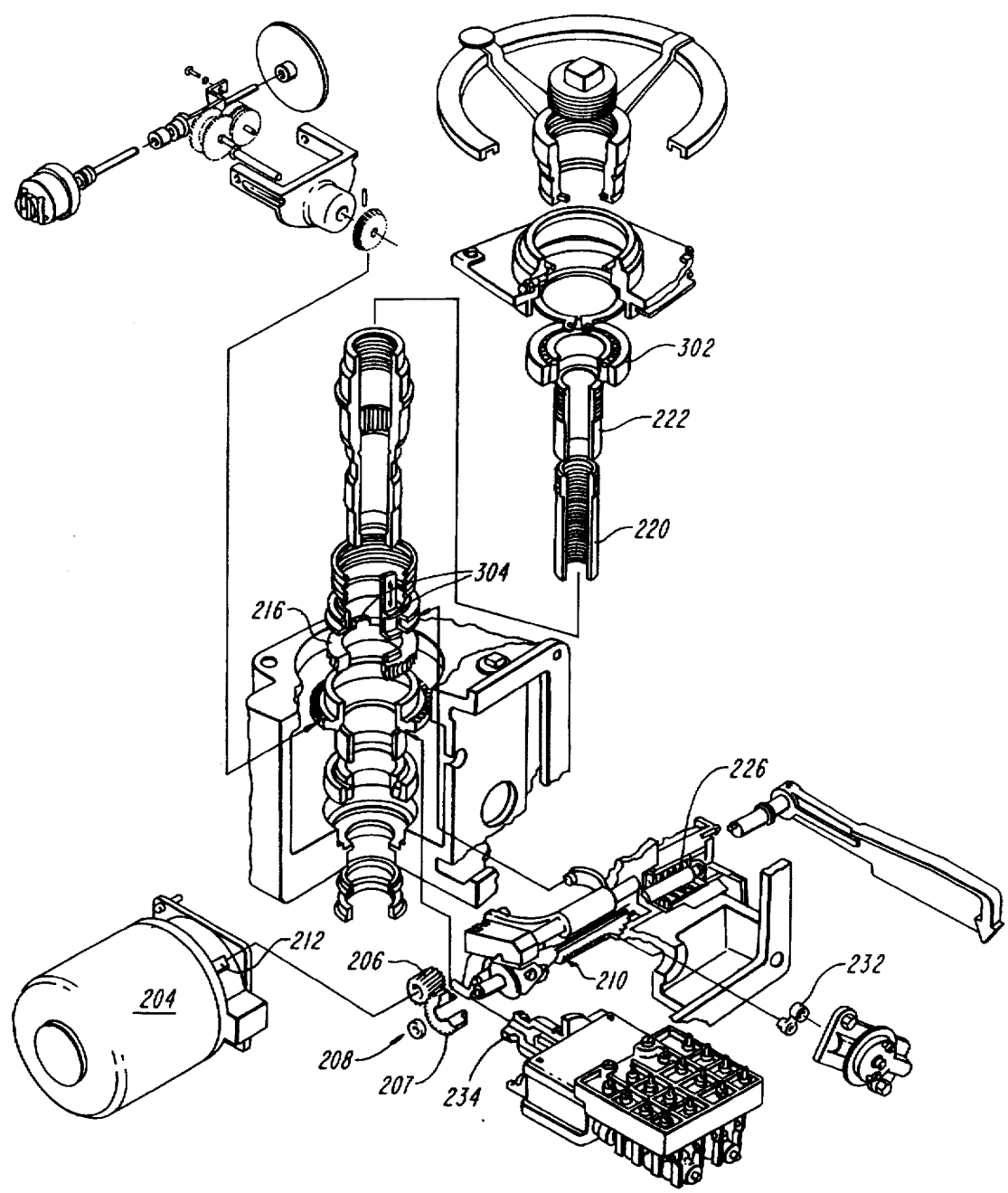
FIG. 3 is an exploded view of a Limitorque SMB-000 motor operator, shown schematically in FIG. 2.

A block diagram of a preferred embodiment of the apparatus of the invention connected to an MOV is shown in FIG. 4. The gear train operator 208 is contained within a housing 430 to which the motor 204 and valve 201 are coupled. Power is supplied to the motor 204 from a power source 432. The signals that the diagnostic apparatus of the invention takes as its inputs are the voltage(s) V and current(s) I input to the motor 204 (typically a three phase motor) and the electrical output of a vibration pickup 434, such as an accelerometer, attached to the outside of the actuator housing 430. (Other types of vibration pickups may be used, such as laser, laser Doppler, eddy current and capacitive.) Typically, the voltage V is measured by a voltage meter 436 and the current I is measured by a current meter 438. A torque estimator 440 takes these voltage and current signals and generates an output signal that corresponds to the torque produced by the motor 204. The vibration pickup 434 generates a signal that corresponds to the mechanical vibration of the housing 430. This signal is passed to a vibration analyzer 442, which generates signals that correspond to the position of the helical gear 207 and the position of the worm gear 216. These signals are passed to a system analyzer 444, which generates signals that correspond to the compression of the spring pack 226 in the operator 208, the position of the valve 201, and the estimated motor torque. These signals are then processed further by a failure and control analyzer 446 to assess the condition of the MOV. The failure and control analyzer 446 compares the condition of the MOV to the conditions of a catalogue of known conditions, assesses whether the MOV is in acceptable operating condition or not and directs appropriate action, such as de-energizing the MOV or energizing a companion valve.

Figure 16:
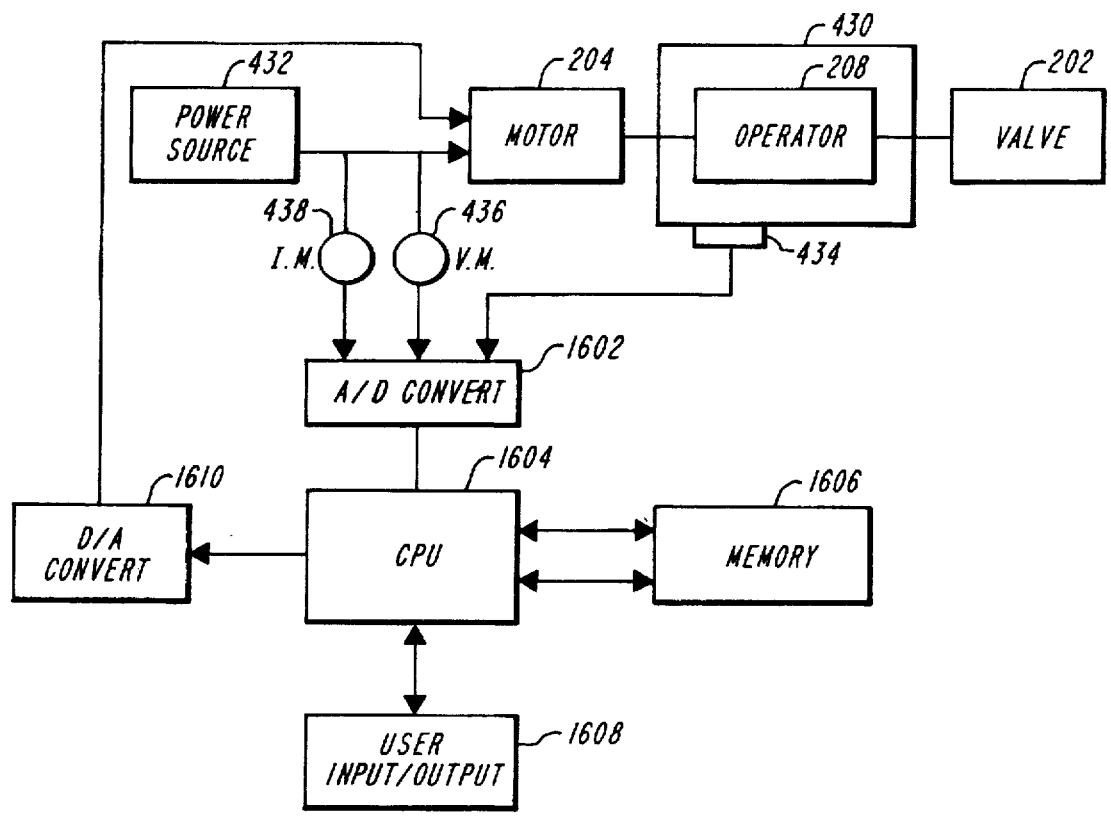
FIG. 16 shows schematically a preferred embodiment of the invention, using a general purpose digital computer that has been programmed to configure it to implement the operations of a vibration analyzer, torque estimator, system analyzer and failure analyzer.

The torque estimator 440 and vibration analyzer 442, system analyzer 444 and failure and control analyzer 446 may be implemented as separate hardware or firmware components. Alternatively, they may all be implemented, in part, as a general purpose digital computer, configured by a software program, to perform the functions discussed below. (Such a configuration is shown schematically in FIG. 16.)

Torque Estimation

The signal representing torque is generated by the torque estimator 440, which, in a preferred embodiment, takes as its inputs the current and the voltage signals identified above. The operation of the torque estimator is as follows.

A typical MOV motor is a three phase induction motor. A torque estimating apparatus and method of the invention is based on the following assumptions:

1. The stator windings are sinusoidally wound, coupling only to the fundamental-space-harmonic component of air-gap flux.
2. The self-inductances of the rotor windings do not vary with rotor angular position.
3. Motor core losses are negligible.
4. Magnetics are linear.

A suitable torque estimator 440 first converts the 3-phase currents and voltages typically used with an MOV motor 204 to equivalent 2-phase currents and voltages. (Analysis is more straight-forward with two phases. No loss of generality arises.) A representative manner by which the invention determines the electric torque is shown in detail in Chai, J., "Non-Invasive Diagnostics of Motor-Operated Valves," submitted in partial fulfillment of the requirements for the degree of Doctor of Philosophy at the Massachusetts Institute of Technology ("MIT"), May 7, 1993, which is incorporated fully herein by reference (referred to herein as the "Chai MIT Thesis"). The portion regarding the torque estimation is at pp. 16–19 and 23–30. This dissertation is available from MIT through its Document Services department, 77 Massachusetts Avenue, Room 14-0551, Cambridge, Mass. 02139-4307 (telephone (617) 253-5650). The Chai MIT Thesis also shows in detail other aspects of the invention, as noted below.

The electric torque T can be obtained:

$$T = P(\lambda_{Sa} i_{Sb} - \lambda_{Sb} i_{Sa}) \quad (1)$$

where $i_{sa}$ and $i_{sb}$ are the two phase stator currents, $\lambda_{sa}$ and $\lambda_{sb}$ are the two phase stator winding flux linkages and P is the number of pole pairs.

In the foregoing relation, the electric torque T is expressed only in terms of the stator variables of currents and flux linkages, which can be measured at the stator terminals. (To measure the flux linkages, some additional signal processing must take place, which is discussed below.)

To determine the electric torque, the flux linkages must be determined from the two phase motor terminal voltages and currents. For the two-phase equivalent motor, the appropriate relationships are:

$$V_{Sa} = R_{Si} i_{Sa} + \frac{d\lambda_{Sa}}{dt} \quad (2)$$

$$V_{Sb} = R_{Si} i_{Sb} + \frac{d\lambda_{Sb}}{dt} \quad (3)$$

where, $R_{Sa}$, $R_{Sb}$, $V_{Sa}$, and $V_S$ are two phase stator winding resistances and voltages, respectively. The resistances can be measured, or obtained from the manufacturer. Resistance is also a function of temperature, which may be significant in some environments, necessitating appropriate compensation. From the Equations (2) (3), the flux linkages can be expressed in terms of the measurable voltages, currents and resistances as:

$$\lambda_{Sa} = \int_{-\infty}^{t} [V_{Sa} - R_{Si} i_{Sa}] dt \quad (4)$$

$$\lambda_{Sb} = \int_{-\infty}^{t} [V_{Sb} - R_{Si} i_{Sb}] dt \quad (5)$$

To use the foregoing relationships to calculate these flux linkages would require an integration from time $t = -\infty$, which is not possible. Alternatively, the integration could start at a finite time, but this would require knowing the initial condition of the integrals, which are generally not known. The integration must start at some time to after the motor is energized. Therefore, Equations (4) and (5) can be rewritten as:

$$\lambda_{Sa} = \int_{-\infty}^{t_0} [V_{Sa} - R_{Si} i_{Sa}] dt + \int_{t_0}^{t} [V_{Sa} - R_{Si} i_{Sa}] dt \quad (6)$$

$$= \lambda_{Sa0} + \int_{t_0}^{t} [V_{Sa} - R_{Si} i_{Sa}] dt$$

$$\lambda_{Sb} = \int_{-\infty}^{t_0} [V_{Sb} - R_{Si} i_{Sb}] dt + \int_{t_0}^{t} [V_{Sb} - R_{Si} i_{Sb}] dt \quad (7)$$

$$= \lambda_{Sb0} + \int_{t_0}^{t} [V_{Sb} - R_{Si} i_{Sb}] dt$$

Since $\lambda_{Sao}$ and $\lambda_{Sbo}$ are generally unknown, they are estimated using a first iteration estimated value of zero. In this case, integration starting from to causes a DC error in each flux linkage estimate due to the initial unknown value of $\lambda_{Sao}$ and $\lambda_{Sbo}$.

In order to minimize the effects of the DC error, a forgetting factor $\gamma$ is introduced. With this factor, the flux linkages can be estimated by the following equations:

$$\hat{\lambda}_{Sa} = \int_{-\infty}^{t} [V_{Sa} - R_{Si} i_{Sa} - \gamma \hat{\lambda}_{Sa}] dt \quad (8A)$$

$$\hat{\lambda}_{Sb} = \int_{-\infty}^{t} [V_{Sb} - R_{Si} i_{Sb} - \gamma \hat{\lambda}_{Sb}] dt \quad (8B)$$

where, the caret ^ indicates that the value is an estimate of the actual value.

Equations 8A and 8B provide expressions for estimating the flux linkages in a continuous mode, such as might be estimated using analog circuitry. If digital sampling circuitry is used, the flux linkages can be expressed as follows:

$$\hat{\lambda}_{Sa_n} = \hat{\lambda}_{Sa_{n-1}} + \int_{t_{n-1}}^{t_n} [V_{Sa} - R_{Sa}i_{Sa} - \gamma\hat{\lambda}_{Sa}]dt \qquad (9A)$$

$$\hat{\lambda}_{Sb_n} = \hat{\lambda}_{Sb_{n-1}} + \int_{t_{n-1}}^{t_n} [V_{Sb} - R_{Sb}i_{Sb} - \gamma\hat{\lambda}_{Sb}]dt \qquad (9B)$$

The subscripts "n" and "n−1" indicate respective sampling times. The remaining integral can be performed using any standard technique, such as forward Euler, backward Euler, trapezoidal, or higher order schemes. (In general, the torque is estimated at periodic intervals, based on periodic samples of voltage and current. The flux linkages for a given moment are determined from a previous iteration.)

The presence of noise also causes problems when integrating, which problems are ameliorated by using a forgetting factor. For example, integrating a pure sinusoid with one sample measurement error results in a sinusoid and a step function due to the measurement error. The measurement error produces an error in the result for all subsequent time, unless a forgetting factor is used. The forgetting factor, as the name implies, causes previous values to be forgotten, so that the step error can be eliminated relatively quickly.

The characteristics of the forgetting factor are examined in the following. The continuous flux linkage estimate equations (8A) and (8B) can be considered as the solution of the differential equations $$\frac{d\hat{\lambda}_{Sa}}{dt} + \gamma\hat{\lambda}_{Sa} = V_{Sa} - R_S i_{Sa} \qquad (10)$$

$$\frac{d\hat{\lambda}_{Sb}}{dt} + \gamma\hat{\lambda}_{Sb} = V_{Sb} - R_S i_{Sb} \qquad (11)$$

It is also useful to introduce the concept of estimation error. The estimation error is the difference between the actual value and the estimated value of flux linkage using a forgetting factor. Neglecting the phase subscripts, the estimation error is:

$$\epsilon = \lambda - \hat{\lambda}. \qquad (12)$$

Subtracting Equation (2) from Equation (10) or Equation (3) from Equation (11) gives:

$$\frac{d\epsilon}{dt} + \gamma\epsilon = \gamma\lambda. \qquad (13)$$

Using the forgetting factor, the effects of initial conditions on the error decay with a time constant $1/\gamma$ (sec.) and the error is driven by the actual flux linkage $\lambda$. Thus, if the flux linkage is of the typical form:

$$\lambda = \Lambda \cos \omega t, \qquad (14)$$

the magnitude of the estimation error will be $$\epsilon = \frac{\gamma}{\sqrt{\omega^2 + \gamma^2}} \Lambda, \qquad (15)$$

where the unknown value of $\Lambda$ can be determined at a later point from the rated line-line voltage by assuming balanced three phase condition. From this, it can be seen that, to achieve a small estimation error, it is necessary to choose a forgetting factor that is much smaller than any frequency of interest.

The torque Equation (1) can be rewritten with the estimated flux linkages:

$$\hat{T} = P(\hat{\lambda}_{Sa}i_{Sb} - \hat{\lambda}_{Sb}i_{Sa}), \qquad (16)$$

where, $\hat{T}$ is the estimated torque.

Since the estimated flux linkages differ from the actual flux linkages by an amount dependent on the forgetting factor, an error will also arise in the estimated torque. Although it is difficult to derive a general analytic expression for the error in the estimated torque, a simple expression can be derived by assuming steady-state conditions with balanced three phase voltages and currents. If the transformed two phase fluxes and currents are the following:

$$\lambda_{Sa} = \Lambda \cos \omega t \qquad (17)$$

$$\lambda_{Sb} = \Lambda \sin \omega t \qquad (18)$$

$$i_{Sa} = I \cos (\omega t + \phi) \qquad (19)$$

$$i_{Sb} = I \sin (\omega t + \phi), \qquad (20)$$

then the actual torque, from Equation (1), becomes $$T = P\Lambda I \sin \phi, \qquad (21)$$

while the estimated torque from Equation (16) will be $$\hat{T} = P\Lambda I \sin\phi - \frac{P\gamma\Lambda I}{\sqrt{\gamma^2 + \omega^2}} \sin\left(\phi - \arctan\left[\frac{\omega}{\gamma}\right]\right). \qquad (22)$$

Comparing Equations (21) and (22), it can be seen that the torque estimation error due to the forgetting factor is equal to:

$$T_{error} = -\frac{P\gamma\Lambda I}{\sqrt{\gamma^2 + \omega^2}} \sin\left(\phi - \arctan\left[\frac{\omega}{\gamma}\right]\right). \qquad (23)$$

Since the motor operating conditions are relatively close to the foregoing assumed balanced operating conditions, the estimated torque can be compensated with the estimated torque error of Equation (23) to improve the torque estimator. The following estimation for torque has been tested and is used in the torque estimator of the invention:

$$\hat{T}_{estimator} = P(\hat{\lambda}_{Sa}i_{Sb} - \hat{\lambda}_{Sb}i_{Sa}) + \qquad (24)$$

$$\frac{P\gamma\Lambda I}{\sqrt{\gamma^2 + \omega^2}} \sin\left(\phi - \arctan\left[\frac{\omega}{\gamma}\right]\right).$$

The estimated flux linkage expressions $\hat{\lambda}_{Sa}$, $\hat{\lambda}_{Sb}$ have been previously obtained by integration of the two phase voltages (transformed from measured three phase voltages) with respect to time, as set forth in Equations (8A) and (8B). Comparing the magnitude of the estimated flux linkage obtained by substituting the assumed flux linkage Equation (17) or (18), into differential Equations (2) and (3) and assuming that Rsis is negligible, leads to:

$$\Lambda = \frac{\sqrt{2}\ V_0}{\omega} \qquad (25)$$

where Vo is the rated rms line-line voltage of the motor. The angle ω is simply set to the power-factor angle of the motor at its rated operating condition.

The implementation of the correction factor set forth above is useful for substantially balanced conditions. If the conditions of the motor are not balanced, the correction factor can be altered to take into account the unbalanced nature of the conditions.

Figure 5:
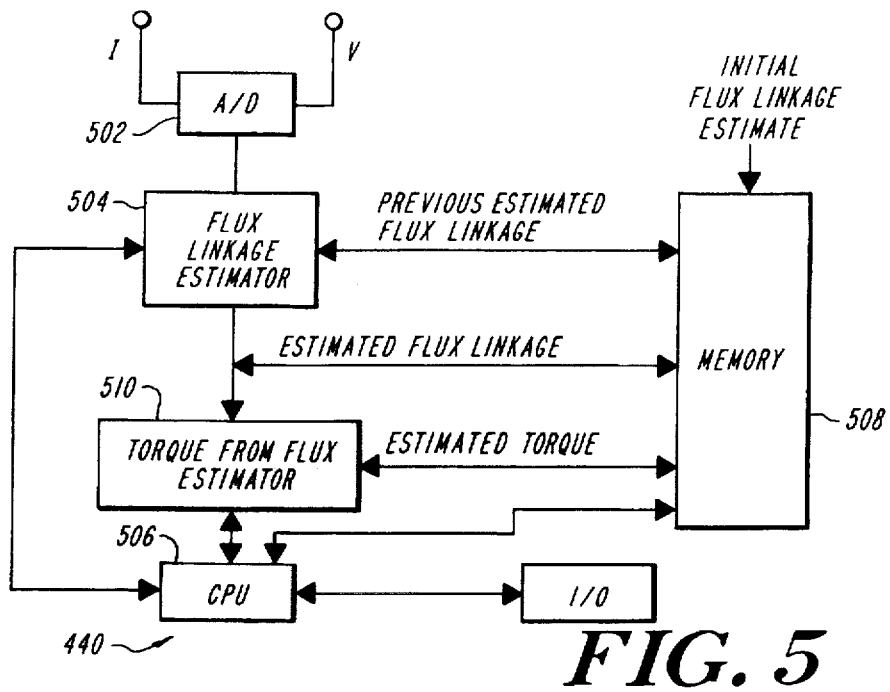
FIG. 5 is a schematic diagram of an embodiment of a torque estimator apparatus of the invention.

A typical, digitally implemented, embodiment of an apparatus of the invention to estimate the torque is shown in block diagram form in FIG. 5. The current I and voltage V are determined by appropriate meters (not shown), and then passed to an A/D converter 502. The digitized current and voltages are passed to flux linkage estimator 504, which generates equivalent two phase currents and voltages, and then estimates a two phase flux linkage, transforming the current and voltage signals according to Equations (9A) and (9B), to generate an estimated two phase flux linkage.

The flux linkage estimator is connected to a central processing unit 506 and a memory 508. The CPU controls the timing and access of the flux linkage estimator processor, and the memory 508 stores the initial flux linkage estimate, typically taken as zero, and subsequent flux linkage estimates output from the flux linkage estimator 504. These estimates are used for subsequent estimates, based in part on current and voltage signals that are measured at corresponding subsequent times.

A processor 510, for estimating the torque from the estimated flux linkage, is connected to the output of the flux linkage estimator 504 and the CPU 506 and the memory. This processor estimates the torque, based on the flux linkages, the forgetting factor and the other parameters set forth in Equation (24), and stores the estimated torque in memory. For every sampling cycle of the A/D convertor, an estimated torque signal is generated, and stored in memory. Thus, a growing signal relating torque to time is stored in the memory 508 as the MOV operates.

Rather than the digital based implementation shown in FIG. 5, the torque estimator can be implemented using analog hardware. An analog simulation can also be made of the flux estimation described by Equations (8A) and (8B) (continuous version).

Returning to the apparatus of the invention for generating signatures relating motor torque to valve travel, the estimated torque is used in conjunction with an analysis of the mechanical gear train of an MOV.

Valve Position Estimation

As shown in FIG. 4, additional signals, generated by the vibration pickup 434 that is fixed to the housing 430 of the MOV, such as an accelerometer, are input to a vibration analyzer 442, which generates as an output, signals that correspond to the position, in rotations, of the helical gear 207 (from a nominal start position), and the rotational position of the worm gear 210. These signals are provided to a system analyzer 444, which also receives the estimated motor torque from the torque estimator 440, and generates signals that correspond to the position of the valve 201 and the motor torque applied by the motor 204 to the operator 208, which, as has been mentioned above, is directly related to the torque applied by the stem nut 220 to the valve stem 224.

The system analyzer 444 also generates a signal that corresponds to an estimation of the compression of the spring pack 226.

These signals are used to generate a profile, or signature, such as shown in FIG. 1, which is analyzed by a failure and control analyzer 446, which identifies the condition of the MOV, either healthy or not. These signals may also be used to control the motor 204 in the same manner as a torque limit switch 228 is used, to prevent against too much torque being applied to the valve 201. These signals may also be used to control the motor 204 in the same manner as the travel limit switch 232, to turn off the motor when the valve 201 reaches a preselected location.

Vibration Signal Processing Apparatus

The nature of the measured signal(s), even from one accelerometer 434, is complex, including effects from various different meshing gear pairs, transients, broad band noise, and periodic functions. In this section, the signal processing apparatus and methods to extract variable gear mesh instantaneous frequencies are discussed.

If one were able to determine the rotation of the worm gear 216, the position of the valve 201 could be calculated, because they are directly related through the threaded stem nut. The position of the worm gear could be determined by counting the number of rotations of the worm gear, or, the number of meshings of the teeth of the worm and the worm gear. Theoretically, the number of tooth meshings could be determined from the vibration of the housing 430, due, at least in part, to the worm gear meshing. However, as is explained below, due to the typical frequency of the worm gear meshing, recovery of the meshing frequency from the vibration of the housing is difficult.

It is more preferred to analyze the vibration of the housing 204 to determine the instantaneous meshing frequency of the pinion gear 206 and the helical gear 207, and to track that over time, thus arriving at the rotation of the helical gear 207. Additional analysis of the helical gear rotation can provide the worm gear rotation, because, the worm gear meshing vibrations modulate the helical meshing vibrations. Thus, both the worm gear meshing and the helical gear meshing frequencies and both rotations can be determined from monitoring the vibration of the housing due to the helical gear meshing. From these two rotations, the valve travel and the spring pack compression can be determined, as set forth in more detail below.

Figure 10A:
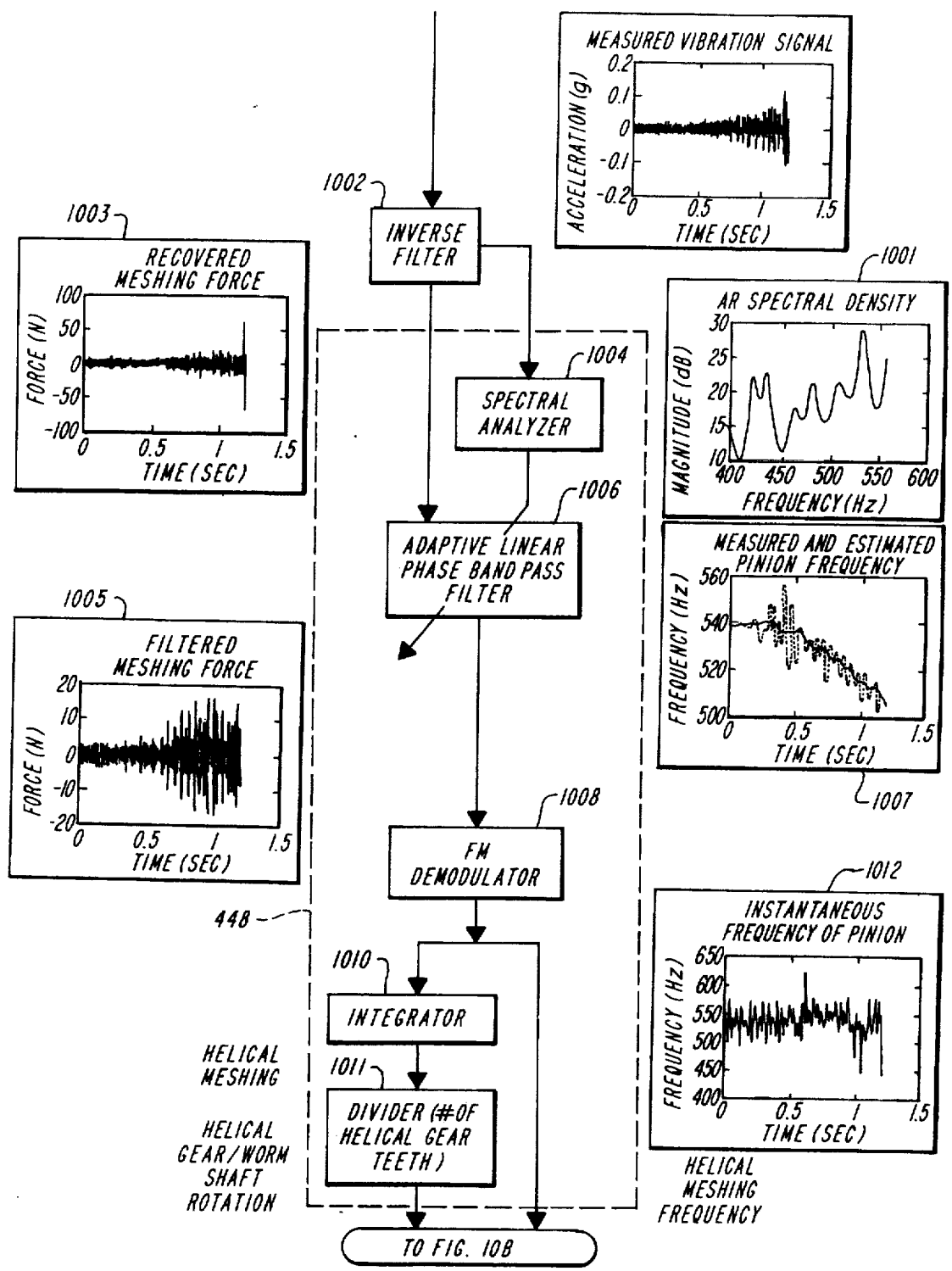
FIG. 10A shows schematically in block diagram form selected elements of a preferred embodiment of the apparatus of the invention, showing an inverse filter, helical mesh vibration analyzer and the worm gear mesh vibration analyzer.
Figure 10B:
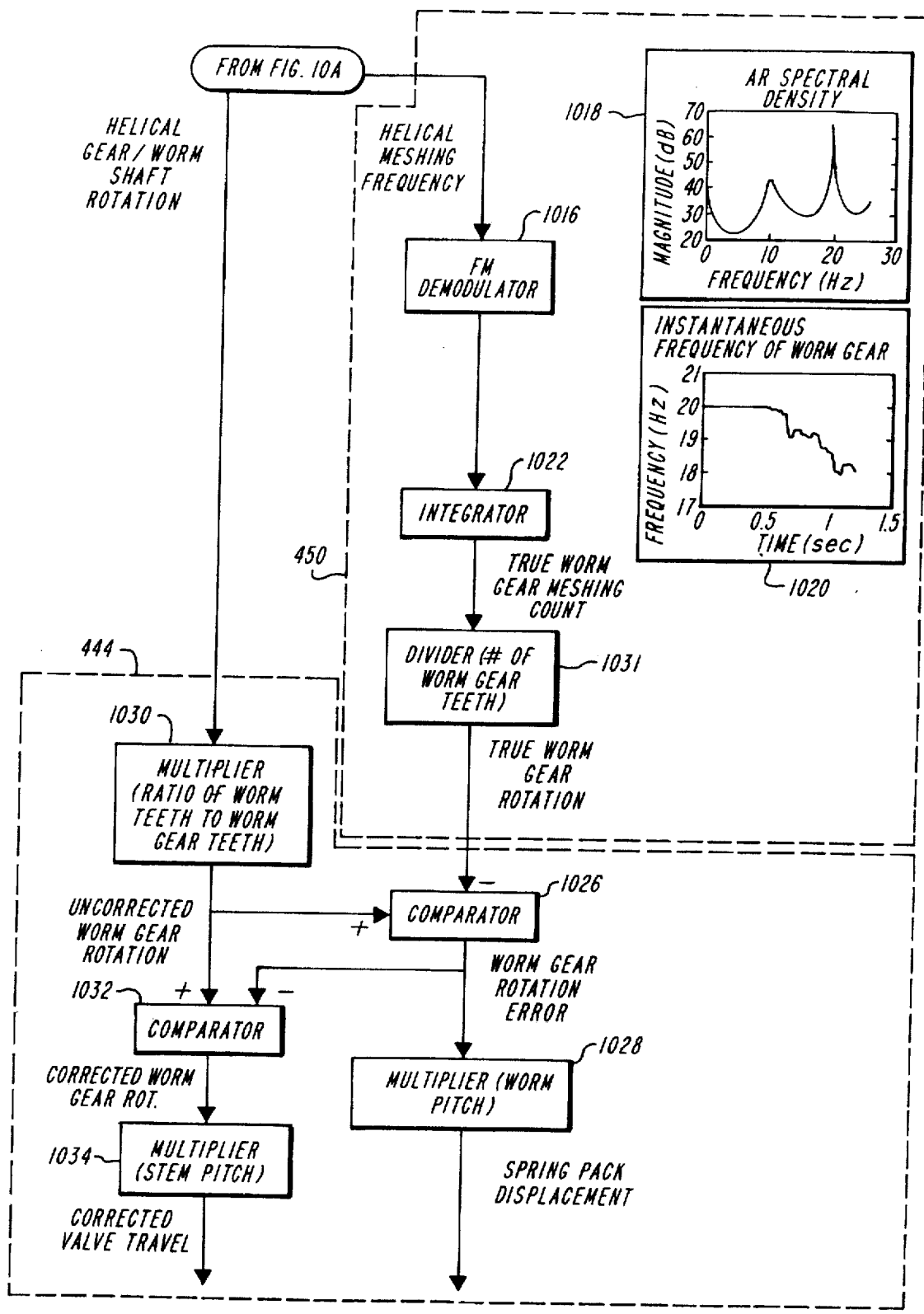
FIG. 10B shows schematically in block diagram form additional selected elements of a preferred embodiment of the apparatus of the invention, showing the system analyzer.

FIGS. 10A and 10B show schematically the elements of the apparatus of the invention that make up the vibration analyzer 442 and a portion of the system analyzer 444. The helical vibration analyzer 448 receives the measured housing vibration signal (an electric signal that corresponds to the mechanical vibration of the housing). The signal first passes through an inverse housing filter 1002, discussed below, which can be considered to be part of the vibration analyzer 442. The output of the inverse housing filter 1002 corresponds to the recovered meshing forces caused by the various gear sets in the housing. This signal relates force to time.

"Inverse Filter"

When the gears in the gear train 208 rotate, the meshing of the teeth produces a force signal. This force generates a mechanical vibration that propagates to the operator housing 430 and can be measured using an externally mounted accelerometer 434 or other suitable vibration pickup.

The gear meshing causes distinctive frequency components in the mesh force signal. As the rotational speed of the gears varies, the tooth meshing rate also changes, and this can be observed as a changing frequency in the spectral components of the vibration signal. Because the number of teeth on each gear is known, the rotational speed can be determined by frequency-demodulating the vibration signal. There are several signal processing methods for frequency-demodulation, each having some advantages over the others, which will be discussed below.

The purpose of the inverse filter is to reconstruct the meshing frequency at the site of meshing, using the vibration signal measured on the housing 430. When the vibratory signal propagates through the structure from the originating meshing teeth, its spectrum is strongly modified by the structural resonances. The prime propagation effects that change the signal spectrum and waveform are dispersion and reverberation. Dispersion changes the waveform because different frequencies travel at different wave speeds. Reverberation is the effect of multiple reflections and propagation along different paths through the structure. These interfering paths produce very sharp variations in the magnitude and phase of the spectrum. An "inverse filter" can be applied to the vibrational signal to reverse these spectral distortions due to propagation, to arrive at a signal that closely approximates the original force signal at the meshing teeth. See generally R. H. Lyon, Machinery Noise and Diagnostics, Butterworth, Boston, 1987, for a discussion of inverse filters, as well as the Chai MIT Thesis, which has been incorporated herein by reference.

Figure 7:
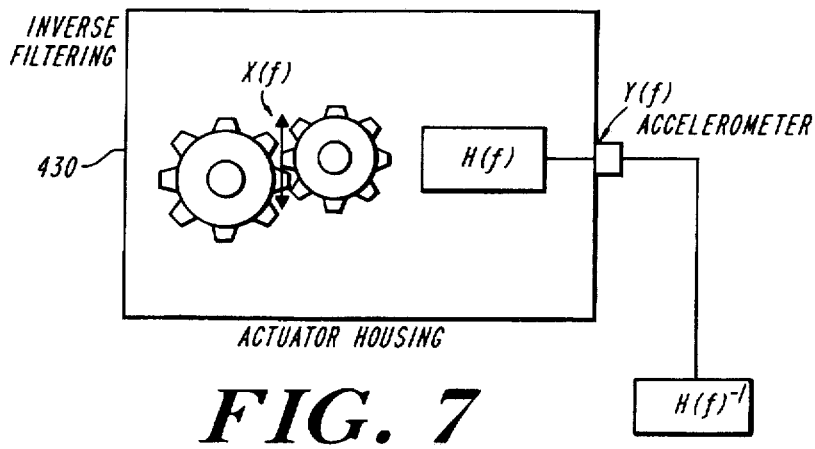
FIG. 7 shows schematically a vibration path having a transfer function H(f) from a meshing pair of gears, to an accelerometer, followed by an inverse filter to reverse the effects of the H(f) path.
Figure 8:
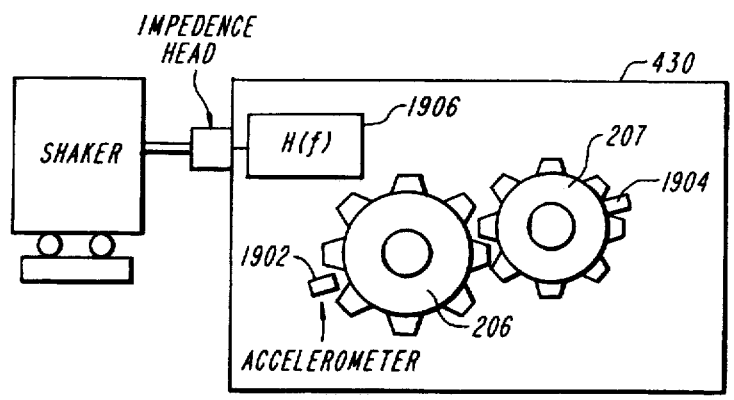
FIG. 8 shows schematically a development apparatus for making an estimate of the transfer function applied by the vibration path between the meshing teeth of the pinion and helical gears and the housing of an MOV.

Any suitable inverse filter is within the contemplation of the invention. The following addresses important factors in the design of such a filter. The first step in designing the inverse filter is to determine a suitable transfer function between the gear meshing forces and actuator housing vibration. The transfer function is obtained experimentally, using a set-up as shown in FIGS. 7 and 8. Since gear meshing forces are generated by the relative motion of a gear pair, special concerns should be taken. In the following, some basic theory and experimental procedures are explained.

Transfer function estimation

The output signal y(t) monitored at the output of a linear time-invariant system is the result of the convolution of the input signal x(t) and the system impulse response function h(t). Since convolution in the time domain is transformed to multiplication in the frequency domain, the relation can be written as follows:

$$Y(f)=H(f)\cdot X(f), \quad (26)$$

where, Y(f), H(f) and X(f) are Fourier transforms of the output, impulse response and input, respectively. H(f) is the transfer function or frequency response function. It can be obtained by the following relation:

$$H(f) = \frac{G_{xy}(f)}{G_{xx}(f)}, \quad (27)$$

where the numerator and the denominator are the cross spectral density and the auto spectral density, respectively. Therefore, if the output is known, the input can be recovered by:

$$X(f)=Y(f)\cdot H^{-1}(f), \quad (28)$$

using an inverse filter which is the physical implementation of $H^{-1}(f)$.

The foregoing relationships, as exemplified in the MOV situation, are shown schematically in FIG. 7. The gear meshing signal is the input signal X(f) and the gear train 208 and housing 430 transform the signal according to the transfer function H(f), indicated schematically simply as a functional box. The output vibration signal, the vibration of the housing 430, is Y(f).

Several different experimental techniques may be used to estimate the frequency response function of a system. The major differences are the choice of excitation function: transient impact excitation, sinusoidal excitation, random noise excitation or natural excitation provided by normal system operation. The pseudo-random noise excitation technique was chosen for the MOV transfer function measurements to provide good coherence.

An important indicator of the statistical quality of the frequency response estimate is the coherence function. The coherence function provides a means of assessing the degree of linear dependence between the input and output signals as a function of frequency.

Transfer function measurement

To measure the transfer function, it is difficult to apply a known gear meshing force at the interface of the gear pair. Since the system is assumed to be linear, passive and bilateral, reciprocity can be applied to generate the transfer function. FIG. 8 shows the reciprocal relation. A pair of accelerometers 1902 and 1904 (Endevco Model 22, San Juan Capistrano, Calif.) are attached on the pinion gear 206 and the helical gear 207, respectively. The accelerometers are attached to measure the relative motion between the gears, in response to a known vibration applied to the housing 430 by the shaker 1910. The sensitivity axes of the two accelerometers are aligned so that only the relative rotational motion of the gear pair is measured.

Since the relative rotational motion is the difference of the two accelerometer outputs, it is important to know the relative sensitivity of two accelerometers very accurately over the frequency range (0 to ≧600 Hz) since the highest meshing frequency of the pinion gear pair is around 540 Hz and the meshing frequency reduces to 0 Hz when the motor stops). For this reason, the accelerometers have to be calibrated as pairs.

The reciprocity conditions indicate that the transfer function measured from the housing to the meshing gear teeth is the same as the transfer function measured from the meshing gear teeth to the housing. Thus, a shaker 1910 can be excited with a known signal, which corresponds to an input signal. The difference between the motions of the gears 206 and 207 constitutes the output signal. These two signals (input and output) can be analyzed using Equation (27) to determine the transfer function H(f) of the housing. Once the housing transfer function is determined, its inverse can be established, using known principals.

Figure 12A:
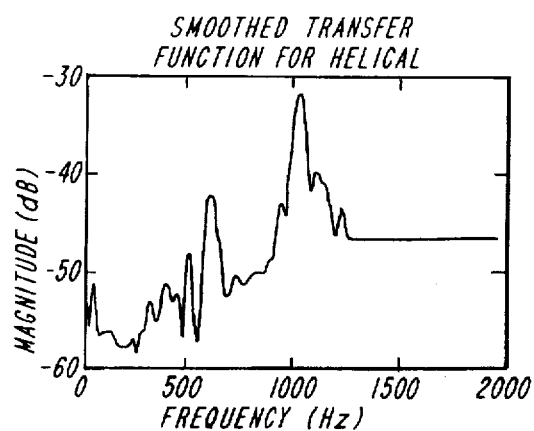
FIGS. 12 A-F show schematically, an example of a typical smoothed transfer function and inverse filter (amplitude and phase) characteristic for the path including the pinion gear and the MOV housing.
Figure 12C:
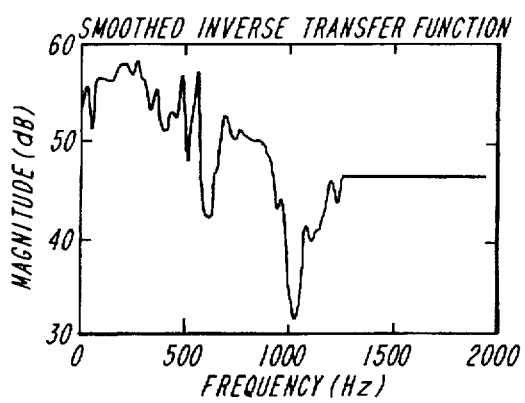
Figure 12B:
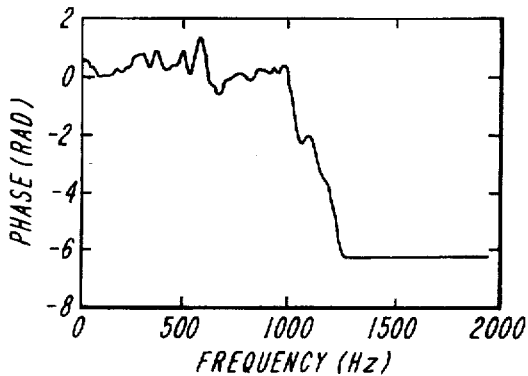
Figure 12D:
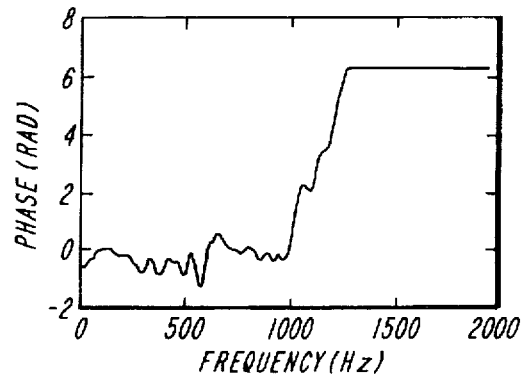
Figure 12E:
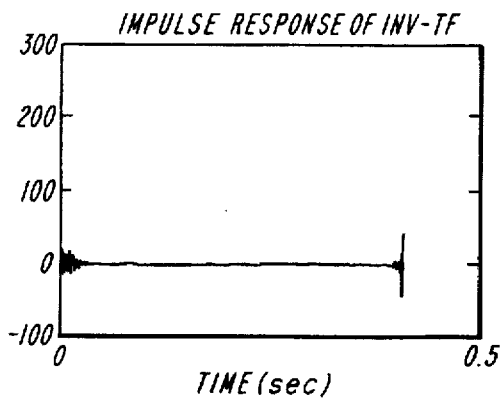
Figure 12F:
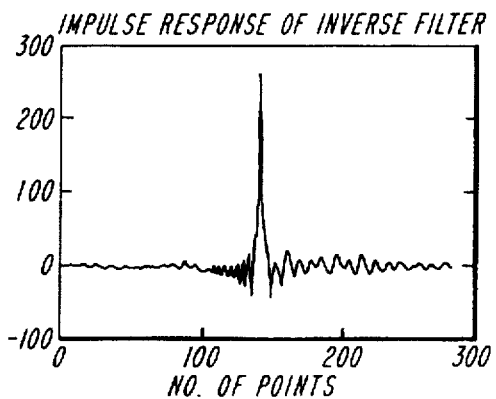

Since the pinion gear meshing frequency is around 540 Hz and the worm gear meshing frequency is around 20 Hz, it is necessary to control the spectrum of excitation in the range of interest. The dynamic range of a frequency response function between the highest resonant peak and the deepest antiresonance is often very large. Since random noise excitation has a relatively flat spectrum, it follows that the response spectrum will have the same large dynamic range as the frequency response function. If the structure is excited only in the frequency range of interest, a better signal-to-noise ratio and cleaner data result. In the experiment, the excitation is limited to 1000 Hz. The resulting transfer function, inverse transfer function, and corresponding impulse responses are shown in FIGS. 12A and 12B (transfer function), 12C and 12D (inverse transfer function) 12E (impulse response of inverse transfer function) and 12F (impulse response of inverse filter).

No matter how precisely the transfer function is measured, the measured transfer function will not perfectly correspond to the actual transfer function between force and vibration during operation of the MOV. Furthermore, the actual transfer function may vary under different operating conditions, different installations, and even during the operating cycle due to the location of each part and temperature which changes the material properties.

It is impractical to create an inverse filter that follows changes in all such parameters. However, if a small change in these installation or operating conditions does not result in a large change in the transfer function, then the measured transfer function can be used directly as an inverse filter to reconstruct the input waveform. Transfer function changes due to several installation conditions and gear loadings, have been examined to analyze the question of transfer function sensitivity. Several excitation locations were tested to find the best sensor location.

Tests have shown that the transfer function is insensitive to the amplitude of the gear meshing force. This indicates that a single transfer function can be used during the operation.

For the Endevco accelerometer identified above, the coherence for the pinion gear set is generally high but there is a drop in coherence in the frequency range near 550 Hz, which is in the frequency range of the pinion meshing frequency. It is desirable to find an accelerometer location for which the transfer function does not have a dip in this important frequency range.

One of the difficulties in implementing an inverse filter is that the filter can have a big peak at the zeros of the system, which may amplify noise. Also the inverse impulse response may be much longer than the impulse response of the transfer function, since the decay of an inverse impulse response is determined by the damping in the antiresonances of the transfer function. To get a robust transfer function and inverse filter, cepstral smoothing with a gaussian window is performed. See generally, R. G. Gibson, "Phase Variability of Structural Transfer Function", M.Sc Thesis, MIT, Dept. of Mech. Eng., February 1986; and, J. Kim, "Source and Path Recovery from Vibration Response Monitoring", Ph.D Thesis, MIT, Dept. of Mech. Eng., March 1987. FIGS. 12A, B, C, and D shows the magnitude and unwrapped phase of a smoothed transfer function and a smoothed inverse transfer function for the pinion gear pair. It is this smoothed version of the transfer function that is used to implement the inverse filter as a finite impulse response (FIR) filter.

As is discussed above, there are two different types of gear sets in a typical MOV; the pinion 206/helical gear 207 set and the worm 210/worm gear 216 set. (For simplification, these are referred to as the "helical" and "worm" gear sets, respectively.)

The matter is more complicated than simply monitoring the rotation of the helical gear 207, because, as mentioned above, the worm 210 can move axially along the splined worm shaft 214 in response to the meshing torque between the worm 210 and the worm gear 216 above a threshold torque $T_0$. This causes a variation in the worm meshing frequency relative to the helical meshing frequency other than would be due to a drive ratio. The axial (or spline) worm displacement along the shaft can be calculated if the difference between the pinion meshing frequency and the worm meshing frequency is known (and used to determine the rotations of each). This axial worm displacement also gives the load on the worm 210, since the worm is connected to the spring pack 226.

Therefore, determining the meshing frequency of the two gear pairs is the first step in finding the position of the important gear train components.

Adaptive Filter

Waveforms that relate gear meshing force to time can be obtained from the vibration using the inverse filter 1002 discussed above. What is desired is the instantaneous frequency of the gears. Before determining the instantaneous frequency from the vibration signal, it is advantageous to perform bandpass filtering to improve the signal-to-noise ratio. This is accomplished by a bandpass filter 1006, that is connected to the output of the inverse filter 1002.

There are several concerns in designing the bandpass filter 1006. First, because the instantaneous frequency is to be determined, the bandpass filter should have linear phase characteristics. That is, the group delay of the bandpass filter should be constant within the passband to pass all frequency components of the signals with the same speed. A finite impulse response ("FIR") filter provides these features. The other considerations are the bandwidth and the center frequency of the bandpass filter.

The worm gear meshing frequency for a typical MOV is around 20 Hz, a range where signals are frequently contaminated by ambient building noise. If information signals and noise were transmitted directly from the worm gear pair to the worm vibration analyzer 450, they would, in general, overlap one another in frequency and there would be no means to separate the information belonging to one information source from that of another. And also in a practical system, the frequency range of worm meshing is too low for reliable frequency demodulation estimation. Thus, rather than trying to determine the worm meshing frequency directly from the vibration signal, a better approach is to analyze the higher frequency components of the vibration signals, attributable principally to the helical gear meshing, for modulation by the lower frequency worm meshing. Since the helical gear rotation speed fluctuates as the worm gear teeth engage, the worm gear meshing frequency shows up as a modulation of helical instantaneous frequency.

Therefore, the worm gear rotation information can be extracted from the higher frequency components of the vibration signal by filtering and demodulation. Thus, in determining the bandwidth of the bandpass filter 1006, it is important to evaluate how widely the modulating worm gear meshing frequency information spreads out in frequency around the helical gear meshing frequency. The bandwidth can be determined if the characteristics of the modulating worm gear signal are roughly known. The helical meshing force signals are modulated by the load and the speed of the worm gear, i.e., they are both amplitude and frequency modulated. For amplitude modulation, the modulating signal frequency components are simply shifted in the frequency domain around the carrier frequency, in this case, the helical meshing frequency. However, for frequency modulation, the modulating information is spread throughout the frequency domain, depending on the non linearity of the modulating procedure.

Studies conducted in connection with this invention have shown that use of 100 Hz as the bandwidth of the bandpass filter is appropriate, since the instantaneous frequency change of the helical gear is similar to the wide-band FM case having two dominant sidebands, spread apart around 20 Hz from each other, which is the worm meshing frequency.

In MOVs, the speed of the motor varies as the load changes. Accordingly, the gear meshing frequencies change during the operation. Therefore, the center frequency of the bandpass filter 1006 must be adjusted to substantially match the meshing frequency. An adaptive apparatus and technique for adjusting the center frequency is useful. (In the schematic drawing shown in FIG. 10A, the filter and adaptive controller are both considered to be within the bandpass filter 1006.)

An open loop adaptive controller is used in the present invention. It estimates the spectral density of the input signals, applies this information to the computation of filter coefficients, and sets the center frequency of the bandpass filter. The spectral density is estimated in the autoregressive ("AR") spectral analyzer 1004, which takes as an input the recovered meshing force signal, indicated schematically at 1003.

The fast Fourier transform (FFT) is typically used for estimating a spectrum. This approach is computationally efficient but has limited frequency resolution. An AR technique avoids the limitation of an FFT approach, and is used in a preferred embodiment of the invention. See generally, L. S. Marple, Digital Spectral Analysis with Applications, Prentice-Hall, New Jersey, 1987; and L. R. Rabiner and R. W. Schafer, Digital Processing of Speech Signals, Prentice-Hall, New Jersey, 1978.

There are also other spectral estimation methods, such as the moving average (MA) and autoregressive moving average (ARMA) models. The AR method uses an all-pole model, whereas the MA method uses an all-zero model and ARMA method uses a pole-zero model.

Basically, any stationary ARMA or MA process of finite variance can be represented as a unique AR model of possible infinite model order. Thus, an AR model of higher order can replace the other types of models. Since the estimation of parameters for an AR model results in linear equations, it is computationally efficient. For the present invention, only the peak location of the meshing force is of interest. Thus, an AR spectral analyzer 1004 is suitable. The AR model approach itself can be used to track the slowly changing frequency with time.

Rather than the AR type analyzer, in certain situations, it may be reasonable to use a spectral analyzer that implements the FFT or MA or ARMA techniques, depending on time and computational constraints.

Frequency Demodulation

The AR spectral analyzer takes as an input a time windowed portion of the recovered meshing force signal (indicated at 1003) from the inverse filter 1002, and generates as one output, a signal 1001 that corresponds to a frequency domain representation of the windowed portion of the meshing force signal. The frequency domain signal relates frequency component amplitude to frequency. It is necessary to analyze this signal to determine the center frequency of the helical gear. There is a dominant peak near 540 Hz, which corresponds to expected helical meshing frequency.

To accomplish this, the magnitudes of the spectral components are examined in the vicinity of the frequency domain where the center frequency is expected. For instance, during periods of steady rotation for a typical MOV, the expected center frequency is in the range of 500 to 560 Hz. This region is examined for peaks, and the largest peak is considered to be the instantaneous center frequency.

The AR spectral analyzer 1004 generates an output signal 1007 that indicates this center frequency. The center frequency varies during the operation of the MOV, from a low of 0 Hz to a high of nearly 600 Hz. The solid curve is the helical meshing frequency estimated using the AR analyzer 1004, and the dotted line is the helical meshing frequency measured (in a verification test) using an optical sensor. (The fluctuation of the measured helical meshing frequency is due to the inaccuracy of the marker for the optical sensor attached to the worm shaft.) The estimated helical meshing frequency line passes through almost the center of the measured helical meshing frequency line, which means that the tracking method is acceptable. This output signal is used by the Adaptive Linear Phase Bandpass Filter 1006 to adjust its pass band, so that the pass band is always substantially symmetrical around the gear mesh frequency.

Application of AR spectral analysis is within the domain of one skilled in the art and is explained fully in the Chai MIT Thesis, at pp. 81–84. See also, in general, L. S. Marple, *Digital Spectral Analysis with Applications*, Prentice-Hall, New Jersey (1987), which is incorporated herein by reference.

The bandpass filter 1006 generates an output signal 1005 that corresponds to the instantaneous meshing force, filtered to remove frequency components of no interest. This signal is then frequency demodulated, by a frequency demodulator 1008 to arrive at an instantaneous meshing frequency signal 1012. This instantaneous frequency signal is the helical meshing frequency and will subsequently be integrated to provide the helical gear rotation.

Frequency demodulation methods have been studied extensively in various fields such as tele-communication and speech processing. In a radio communication system, where the amplitude of a signal is almost constant and the carrier frequency is much higher than that of the modulating signal, frequency demodulation is done using phase-locked loops. However, since the worm gear meshing frequency range in this case is a substantial fraction of the helical gear meshing frequency, other methods must be considered. Teager energy operator, Wigner-Ville distribution, Hilbert transform, short-time Fourier transform (STFT), Wavelet transform and parametric signal analysis have been reviewed and tested.

Given a signal, the Hilbert transform provides the complex part of the corresponding analytic signal, from which the envelope function and the instantaneous frequency can be calculated. In practice, the calculation is done using the FFT, which assumes that the signal is periodic. Therefore, the signal to be analyzed should be periodic. The signal from the time just before the motor turns on to that just after the motor turns off can be considered as a periodic signal. However, when the value of the envelope function is very small, which often occurs in a noisy signal, the Hilbert transform method produces instantaneous frequency estimates that are too high.

Teager's energy operator is a recently developed method in speech processing. It is discussed fully in the incorporated Chai MIT Thesis. The first step is to calculate the instantaneous energy of a signal using Teager's energy operator, which approximately tracks the product of a signal's envelope and its instantaneous frequency. These two entities are then separated. See generally P. Maragos, J. F. Kaiser and T. F. Quatieri, "On Detecting Amplitude and Frequency Modulations Using Energy Operators", Tech. Report 91-6, Harvard Robotics Lab, April 1991; and P. Maragos, J. F. Kaiser and T. F. Quatieri, "On Separating Amplitude from Frequency Modulations Using Energy Operators", 1992 International Conference on Acoustic, Speech, and Signal Processing, March 23–26, 1992, both of which are incorporated herein fully by reference. The technique has a very efficient computational scheme using only five consecutive points of a sampled signal to estimate the envelope and the instantaneous frequency of the signal. Teager's method does not assume signal periodicity and errors due to the beginning and ending portions of a signal are only five data points long. However, since this method assumes only one sinusoidal component at each moment in time, it has poor performance in the presence of noise. The error of the instantaneous frequency estimation due to noise is more severe than that using the Hilbert transform method. Additional processing of the Teager instantaneous frequency signal by eliminating its sharp spikes, provides beneficial results.

STFT, wavelet transform and Wigner-Ville distribution methods are joint time-frequency domain approaches. STFT calculates the Fourier transformation of each time frame generated by a sliding window in equal time increments. The frequency resolution is determined by the window length and is constant along the frequency axis.

In some fields, such as acoustics or pattern recognition, varying resolution in the frequency domain is sometimes desirable. The wavelet transform can meet such a need. Also, certain special purpose analysis characteristics can be provided by selecting a suitable wavelet.

Both methods can be represented with a series of bandpass filters. For the STFT case, the center frequencies of the bandpass filters are evenly distributed. This filter bank approach is suited to problems in which the frequency components of interest are concentrated in a certain small range. For the wavelet transform, the filter center frequencies are distributed proportional to the frequency. If a progressive wavelet is chosen, then the wavelet transform produces the analytic signal in each bandpass filter. Therefore, a progressive wavelet transform can be used as a combined tracking filter and frequency demodulator. The technique produces good results when simulated noise-free data is used having a dominant peak at the meshing frequency. However, since the actual MOV signals contain noise and many other frequency components, the wavelet method is not expected to be a prime candidate. It may, however, be useful in minimal noise environments.

Both the STFT and the wavelet transform assume that the signals are stationary on short-time bases (windowed data). The assumed short-time stability determines the frequency resolution. A joint time-frequency domain characterization of a signal that overcomes this drawback is the Wigner distribution. The concept of the Wigner distribution was introduced in the context of quantum mechanics and reintroduced for signal analysis by Ville. See generally, T. A. C. M. Claasen and W. F. G. Mecklenbruker, "The Wigner Distribution—A tool for Time-Frequency Signal Analysis, Part I–III", Philips Journal of Research, Vol. 35, pp. 217–250, 276–300 and 372–389, 1980; K. M. Wong and Q. Jin, "Estimation of the Time-Varying Frequency of a Signal: The Cramer-Rao Bound and the Application of Wigner Distribution", IEEE Transactions on Acoustic, Speech, and Signal Processing, Vol. 38, No. 3, March 1980; and N. Yen, "Time and frequency representation of acoustic signals by means of the Wigner distribution function: Implementation and interpretation", J. Acoust. Soc. Am. 81 (6), June, 1987, all three of which are incorporated herein fully by reference. The Chai MIT Thesis discusses the application of the Wigner-Ville technique to demodulation at pp. 75–80.

Roughly speaking, the Wigner-Ville distribution of a signal can be interpreted as a function that indicates the distribution of the signal energy over time and frequency. Among the many characteristics important for frequency demodulation is that the average frequency of the Wigner-Ville distribution at a certain instant is equal to the instantaneous frequency of the signal. Using the Wigner-Ville distribution in calculating the instantaneous frequency of a signal is a robust technique, however, it requires significant processing time and large memory space. However, it also has a particular drawback.

In the Wigner-Ville distribution, there always exist interference terms between frequency peaks. These interfering peaks make it difficult to estimate the locations of an actual frequency peak of a signal. Therefore, as with other frequency demodulation methods, bandpass filtering should be performed to remove other signal components before the demodulation. Since the pinion meshing frequency is around 540 Hz, Wigner-Ville distribution can be used to estimate instantaneous frequency after the signal has been adaptively filtered.

The instantaneous frequency signal 1012 of the filtered meshing force signal 1005, is output by the FM demodulator 1008. This signal fluctuates around the 540 Hz carrier frequency in a typical case. The fluctuation corresponds to the modulation of the helical gear rotating speed due to its loading from the worm and worm gear meshing. The instantaneous helical meshing frequency signal 1012 is next passed to an integrator 1010, which generates a signal that corresponds to the number of tooth meshings of the helical gear.

The instantaneous helical meshing frequency signal 1012 is also passed from the helical vibration analyzer 448 to the worm gear vibration analyzer 450. The first stage of the worm vibration analyzer is predominantly a second FM demodulator 1016 which uses an AR analysis technique.

The second demodulator 1016 demodulates the instantaneous helical frequency signal 1012 to recover from it the instantaneous frequency of the worm gear meshing. The means by which AR analysis can be used to perform such a demodulation is within the competence of one of ordinary skill in the art. Further, it is set forth in the Chai MIT Thesis at pp. 81–84.

The output of the second FM demodulator 1016 is a signal 1020 that represents the instantaneous meshing frequency of the worm gear 216, and is discussed below. An example of the AR spectral density of the instantaneous worm meshing frequency is shown at 1018. There is a dominant peak around 20 Hz. As before, the FM demodulator tracks the peak and generates an output signal 1020 that corresponds to the instantaneous frequency of the meshing of the worm 210 and the worm gear 216, which directly describes the rotation of the worm gear.

Returning to the helical meshing signal output from the integrator 1010, this signal is passed to the system analyzer 444 for further treatment. A divider 1011 divides the signal by the number of teeth of the helical gear, and outputs a signal that represents the number of helical gear rotations, which is the same as the number of worm shaft rotations. This helical gear rotation signal is scaled at a multiplier 1030, which multiplies it by the ratio of the number of worm teeth to the number of worm gear teeth, to arrive at an "uncorrected" worm gear rotation. If the helical gear 207 were connected directly to the worm gear 216, without the interposition of the splined shaft 214, this signal would represent the true worm gear rotation.

This signal does not represent the true worm gear rotation, because there has been no correction made for the fact that the worm may have slid on the splined shaft, compressing the spring pack, rather than being fully devoted to converting helical gear motion into worm gear motion. The amount by which the spline has slid can be determined by comparing (at a comparator 1026) the "uncorrected" worm gear rotation, based strictly on the rotation of the helical gear and assuming no sliding, with the true worm gear rotation, determined from demodulating the fluctuations in helical gear frequency, and integrating.

To generate the "true" worm gear rotation signal, the instantaneous worm meshing frequency signal output from the FM demodulator 1016 is integrated at a second integrator 1022 to generate the worm gear meshing signal. This signal is passed to a divider 1031 where it is divided by the number of worm gear teeth, to arrive at a true worm gear rotation signal.

Since a difference between the uncorrected rotation of the worm gear based on scaled rotation of the helical gear and the true rotation of the worm gear based on demodulating the rotation of the helical gear is due to compression of the spring pack 226, the spring pack displacement can be calculated from the gear rotations by comparing the uncorrected and true worm gear rotation signals at a comparator 1026, which is part of the system analyzer 444. The resultant signal must be scaled according to the worm pitch at a multiplier 1028 (also part of the system analyzer), to produce a signal that corresponds to the compression of the spring pack, in suitable units of length.

The valve travel is due to rotation of the worm gear. The uncorrected worm gear rotation signal results in a rather high resolution signal output from the multiplier 1030. However, this is the worm gear rotation, uncorrected for spring pack compression. The worm gear error correction due to spring pack compression is subtracted from the uncorrected worm gear rotation at a comparator 1032. The thus, corrected worm gear rotation signal is multiplied by the stem pitch at a multiplier 1034 to generate a signal that corresponds to the valve travel, corrected for the spring pack compression. This is one of the desired signals for generating an operating signature. (The comparator 1032 and the multiplier 1034 are also part of the system analyzer 444.)

Figure 6:
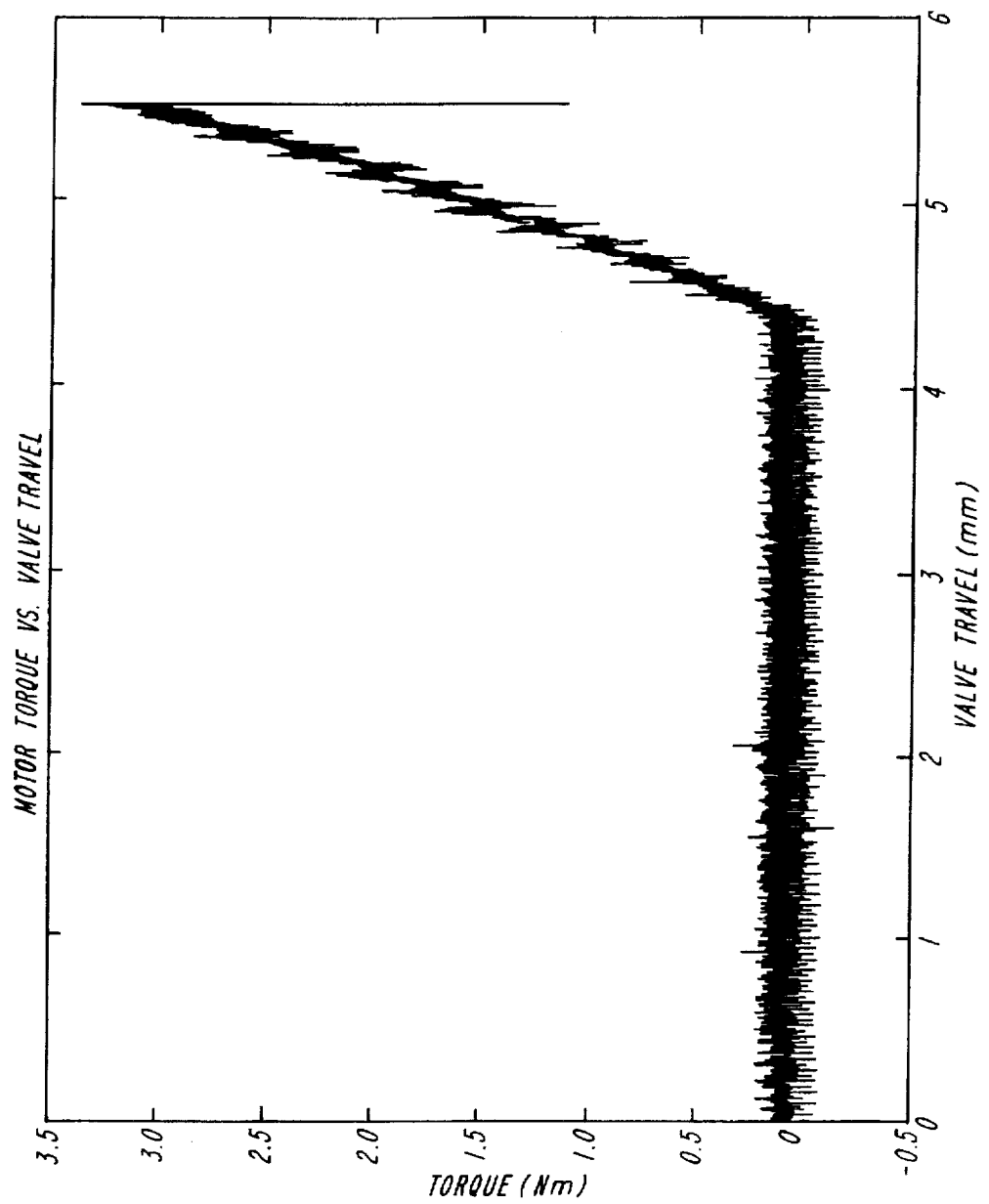
FIG. 6 is a schematic representation of a typical torque v. position signature.

Thus, it has been shown how the vibration analyzer 442 and the system analyzer 444 generate two signals: one relates the valve travel to time and the other relates the spring pack displacement to time. Simultaneously, the torque estimator relates torque to time. The torque signal and the valve travel signal can be combined to generate a signature signal that relates torque to valve travel, as shown schematically in FIG. 6. This signal can be compared to a catalogue of signals, such as shown in FIG. 1, to assess valve condition.

Similarly, a signal relating the torque to the spring pack compression can be generated, which can also be compared to a catalogue of torque vs. spring pack signature signals, to asses valve condition.

Unnecessary computation can be avoided, if necessary, by eliminating the analysis of the worm gear rotation through the worm gear vibration analyzer 450 for certain phases of the operation of the MOV. This analysis is necessary only to correct for the fact that the worm gear does not rotate relative to the helical gear according to a direct gear ratio when the torque exceeds $T_0$ and the spring pack compresses. However, in the absence of spring pack compression, the worm gear does rotate according to the direct ratio, and separate analysis is not needed. Thus, a torque load tester can be added such that the worm meshing vibration analysis is performed by the worm mesh vibrator analyzer 450 only for those times during which the torque exceeds $T_0$. The torque load tester is provided the estimated torque from the torque estimator of the invention to make this evaluation.

Eliminating the worm meshing vibration analysis during this time when the torque is less than $T_0$ also avoids problems that might arise due to the integration of noise in the signals over a longer period of time than is necessary.

In some situations, it may be possible to eliminate the worm meshing vibration analysis altogether for the purpose of determining valve travel. This is because, typically, the difference in valve travel due to the spring pack compression is very small. For instance, in a typical case, the total spring pack compression may be on the order of five millimeters. The valve travel that corresponds to the full five millimeters is on the order of one-tenth of a millimeter, which is negligible for most applications relating to identification and comparison of torque vs. valve travel signatures. Thus, even in the case of spring pack compression, the "uncorrected" worm gear rotation may be used with beneficial results. Thus, the vibration analyzer of the invention may also be constituted without the worm gear vibration analyzer 450.

Although the apparatus of the invention is described above in terms of an apparatus for assessing the condition of a motor operated valve, it will be understood that the several of the components of the invention are also individually novel apparati, having numerous beneficial uses.

For instance, the torque estimator, using the forgetting factor and the correction for the error caused by a forgetting factor, is a novel apparatus for measuring the output torque of any motor, using only the input voltage and currents. Thus, in one aspect, the invention is a torque estimator, as described.

Further, the torque estimator may be accompanied by motor control circuitry, as described above, to replace the torque limit switch on an MOV. It can be used with any other motor operated device that has a control function switch based on torques applied between components connected to the motor.

The vibration analyzer 442 and portions of the system analyzer shown in FIG. 10B can be used without being associated with a torque estimator, to replace the travel limit switch that is triggered based on the degree of valve travel. Because the system analyzer 444 also estimates spring pack compression, which is directly related to the torque applied to the valve, it too can be used as a stand alone torque switch in an MOV.

Experiments

Experiments have been carried out on a stand alone wedge gate valve with a Limitorque SMB-000 motor actuator, set up generally as shown in FIG. 4. In this experiment, two phase voltages and currents of a three phase induction motor as well as the housing vibration (acceleration) were measured. The voltages were scaled through a voltage divider (not shown) and the currents were measured with current probes. Acceleration was measured with an accelerometer 434 attached to the actuator housing 430. Measurement signals were digitized at a 5,000 Hz sampling rate after passing through anti-aliasing filters. The signal processing apparatus, such as is explained in detail above, was subdivided into two basic modules. The torque estimator 440 estimated electric motor torque from the measured voltages and currents. The vibration analyzer 442 estimated worm gear position and helical gear position. A system analyzer 444 generates signals that correspond to spring pack displacement and valve displacement. These estimated values are used in the diagnostic failure and control analyzer 446 of the apparatus.

The estimators have been validated by comparing their outputs with the motor speed, which was directly measured with an optical sensor (not shown) and the spring pack force that was measured with a force ring (not shown) located at the end of the spring pack. The validation was made more comprehensive by placing various obstructions (steel and aluminum rod) in the path of the closing valve. These obstructions represent various fault characteristics in a MOV.

Torque Estimator

Figure 11:
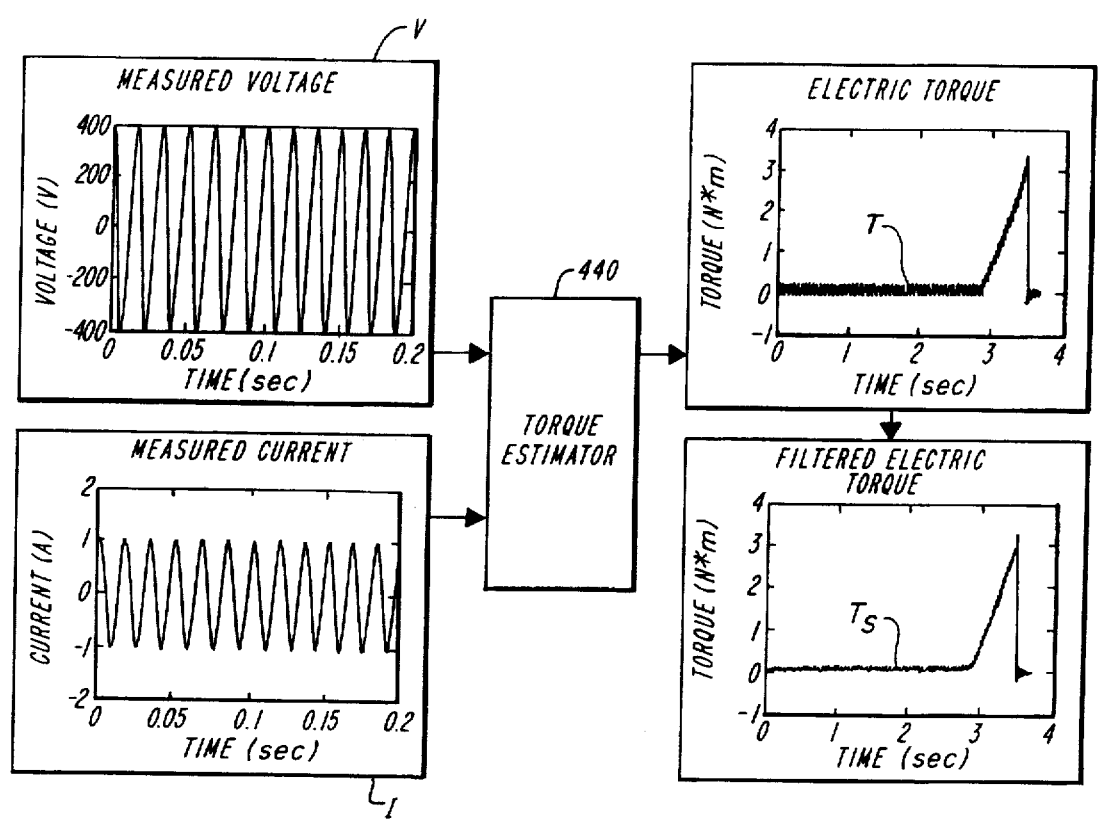
FIG. 11 shows schematically an embodiment of the torque estimator apparatus of the invention and representative input and output signals.

The performance of the torque estimator module 440 is exemplified by the data shown in FIG. 11. The measured voltages (V) and currents (I), applied to the torque estimator 440, produce a signal that represents torque vs. time. The measured terminal voltages (V) were around 400 V and the measured currents (I) varied with the load of the motor. The torque vs. time curve T was smoothed by low-pass filtering as shown at $T_s$. The cut-off frequency was 25 Hz, which is higher than the worm meshing frequency.

The estimated torque and estimated spring pack displacement were compared with the measured values for the cases in which a steel rod and an aluminum rod were placed in the valve as obstructions.

Figure 9A:
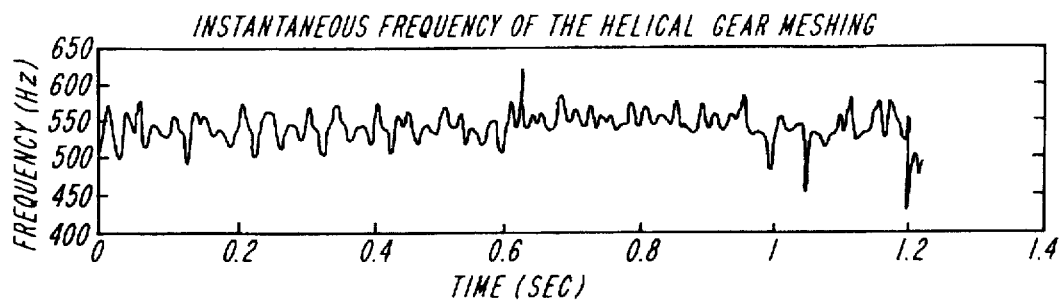
FIGS. 9A and 9B show schematically the instantaneous frequency of the pinion and worm gear, respectively.
Figure 9B:
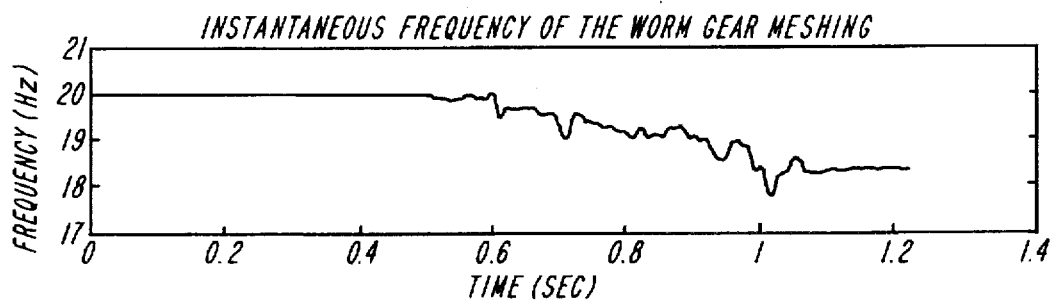
Figure 9C:
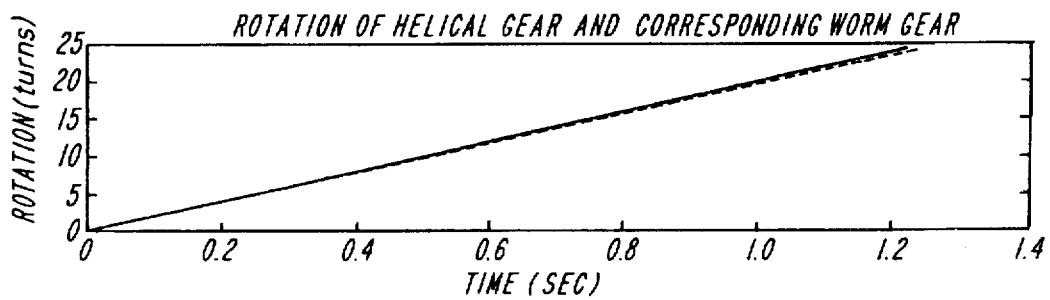
FIG. 9C shows schematically, the helical gear and scaled worm gear rotation.
Figure 9D:
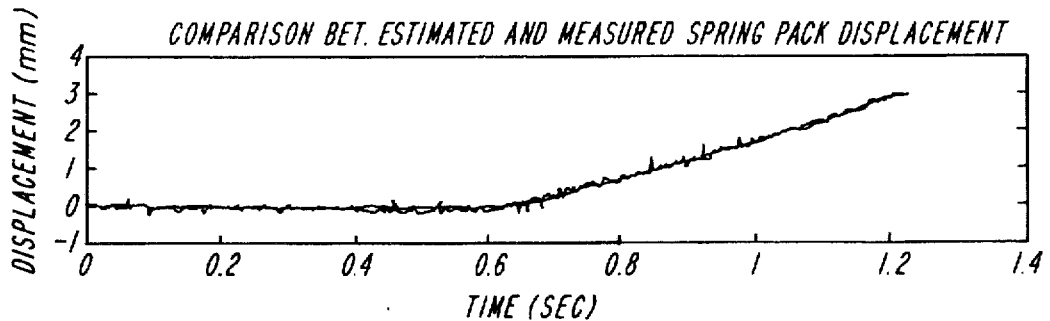
FIG. 9D shows schematically a comparison between the spring pack displacement, as estimated using an embodiment of the invention, and as measured by an experimental validation of the apparatus.
Figure 17A:
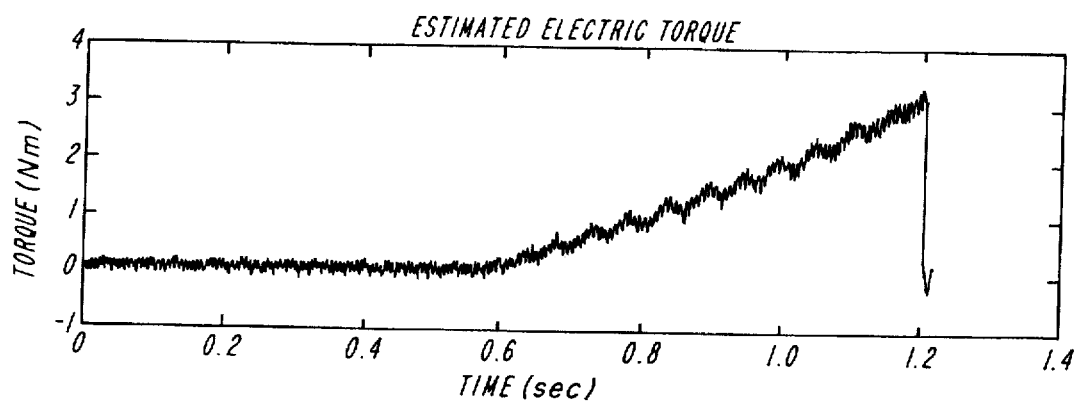
FIG. 17A shows schematically the electric torque, as estimated by the apparatus of the invention.
Figure 17B:
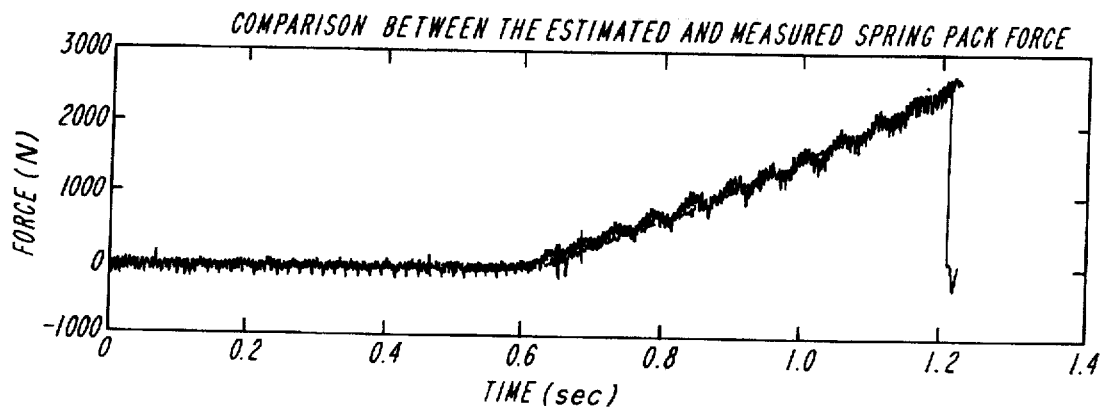
FIG. 17B shows schematically a comparison between the estimated torque shown in FIG. 17A and the force in the spring pack, as measured by an experimental validation of the apparatus.
Figure 17C:
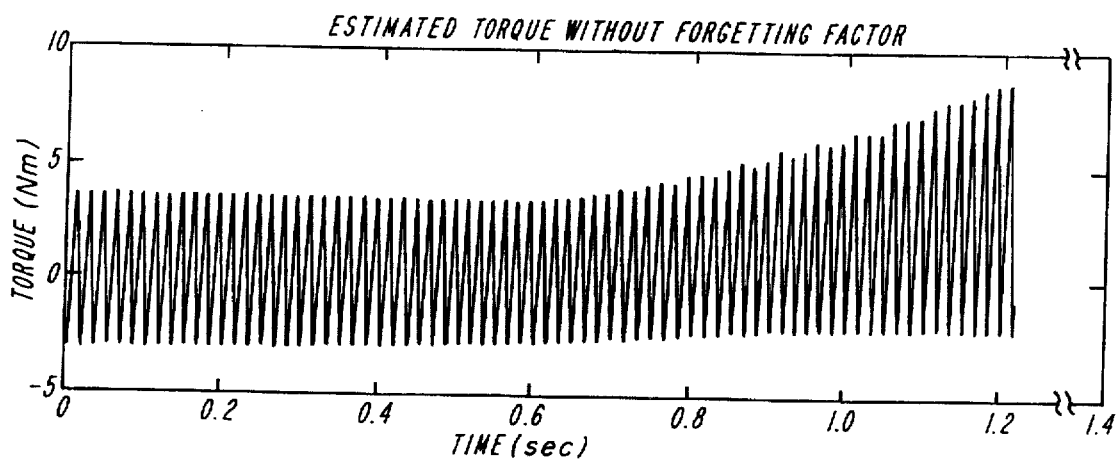
FIG. 17C shows schematically the electric torque, as estimated by an embodiment of the apparatus of the invention without using a forgetting factor.

FIG. 17A shows the electric motor torque estimated by the apparatus of the invention when a steel rod was placed in the valve as an obstruction. The estimate is shown in FIG. 17B compared with the spring pack force measured using a force ring. There is good agreement as long as the motor is energized. FIGS. 9A and 9B show the instantaneous frequency of the helical gear meshing and the worm gear meshing, respectively, as estimated by the apparatus of the invention. An integration of each instantaneous frequency yields the rotation of each gear shown in FIG. 9C. The solid line is the rotation of the helical gear 207 and the dotted line is the rotation of the worm gear 216 scaled to match the helical gear rotation. The difference is due to the sliding of the worm 210 along the worm shaft. The spring pack displacement can be estimated by multiplying this difference by the pitch of the worm, as shown above. This estimate was compared with the spring pack displacement measured using the force ring. The comparison is shown in FIG. 9D. The curves match well.

The same types of experiments were conducted for an obstruction of an aluminum rod. Again, the estimated and measured values are in good agreement.

The invention has been described above, principally in connection with apparatus that is used to asses the condition of an MOV. The method of using the novel apparatus described above is also novel, and thus, the invention also includes a method aspect. Depending on the type of the MOV involved, the apparatus used to practice the method may be similar to that described above, or, it may be different.

Figure 13:
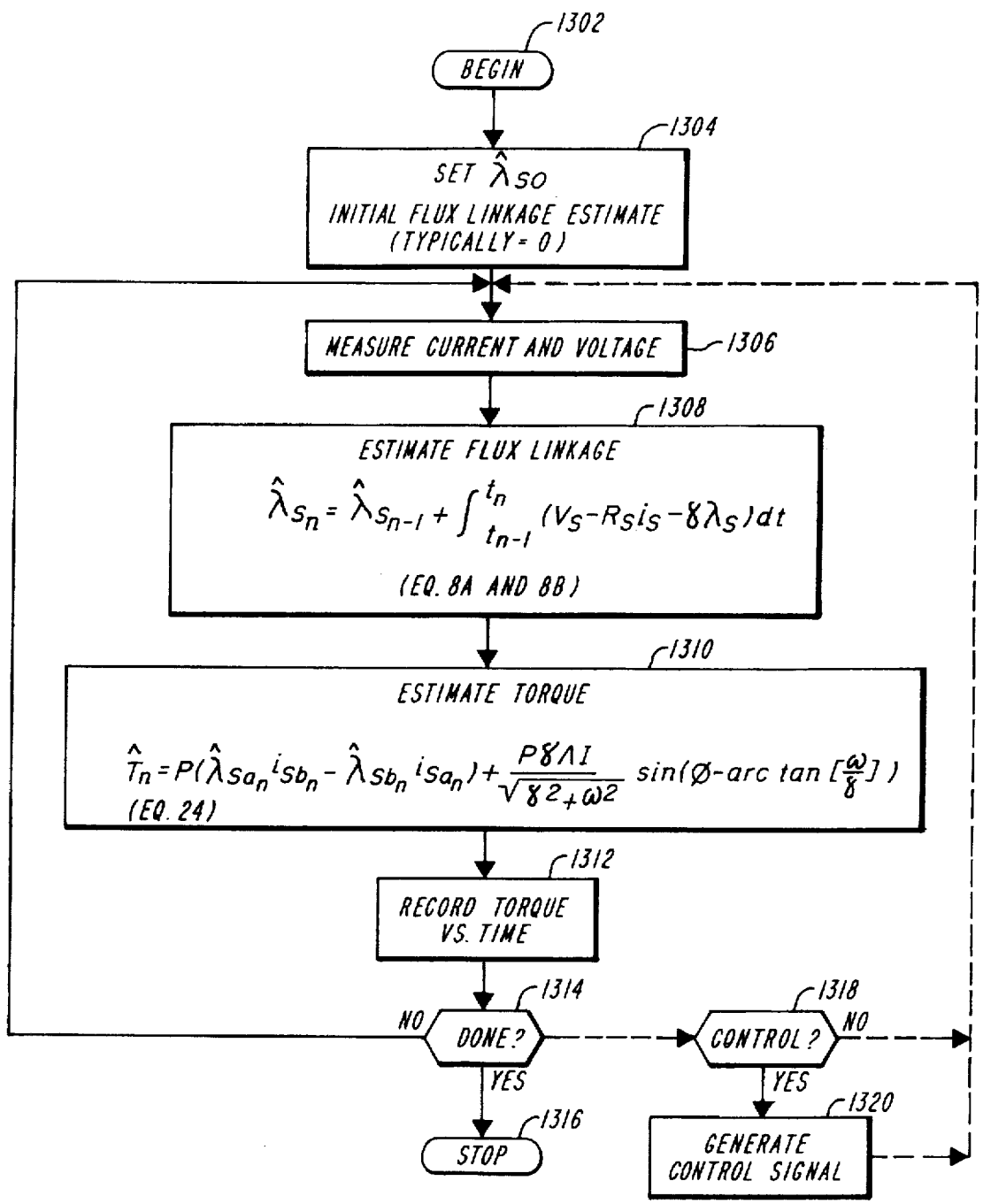
FIG. 13 shows schematically the steps conducted by the torque estimator of a preferred embodiment of the apparatus of the invention, as well as the steps of the torque estimation portion of a preferred embodiment of the method of the invention.

The method of the invention for estimating torque is summarized schematically by FIG. 13, which is a flow chart showing the major steps that are conducted by a preferred embodiment of the torque estimator 440. Novel aspects of the method include using a forgetting factor, and correcting for the error caused by the forgetting factor. The estimator begins at 1302 and next sets 1304 the initial values for the estimated flux linkages $\hat{\lambda}_{sa0}, \hat{\lambda}_{sb0}$. Typically, the initial estimate is zero. Next, the estimator measures 1306 the current and voltage input to the motor. Typically, the current and voltage measurements are taken at a 5 kHz sampling rate. (These measurements typically reflect a three phase motor, and are converted to a two phase equivalent.) The measurements may be stored, and are also used in the next step, which is to estimate 1308 the estimated flux linkages $\hat{\lambda}_{sa}$, $\hat{\lambda}_{sb}$, using the relations (8A) and (8B) or (9A) and (9B). The flux linkages are used by the estimator to estimate 1310 the estimated torque, using equation (24). The torque is estimated using a forgetting factor and also takes into account and corrects for the error due to the forgetting factor. A signal representing the torque relative to time is recorded 1312 in memory, or an appropriate recording medium. (It may also be transmitted or otherwise appropriately noted.) The estimator evaluates 1314 whether the entire estimation cycle is finished, depending on an appropriate parameter, typically, operating time. If the estimation cycle is finished, the estimator stops 1316. If the estimation cycle is to continue, the estimator returns to again measure 1306 the current and voltage. When the flux linkages are estimated again, the flux linkage for the new cycle period is determined using the flux linkage for the previous sample period.

When the entire cycle has been completed, the result is a signal that relates the estimated torque to the time. This signal can be stored, displayed, graphed or further processed. Typically, it is used in combination with another signal, generated by the vibration analyzer, which relates the position of the valve to time. The resultant combined signal relates torque to valve position, and constitutes an MOV signature, as discussed above.

The estimated torque can be used to determine 1318 whether a control signal must be issued. Such a signal would be issued if the estimated torque falls within certain ranges. For instance, if the torque exceeds a certain threshold, that could indicate a problem with the MOV, such as a blockage. (These optional steps are indicated by the dotted line pathway.) Consequently, the estimator would generate 1320 a control signal, for instance to cut off power to the motor, or to sound an alarm, etc. In this manner, the torque estimator of the invention can take the place of the troublesome torque limit switches, which are currently incorporated in the spring pack. An advantage of using the torque estimator of the invention as a torque limit switch is that it does not rely on mechanical switches, which can become dirty, clogged or otherwise inoperable. Further, it does not require an additional control line from the spring pack to the motor, such as is required with a conventional torque limit switch.

Figure 14:
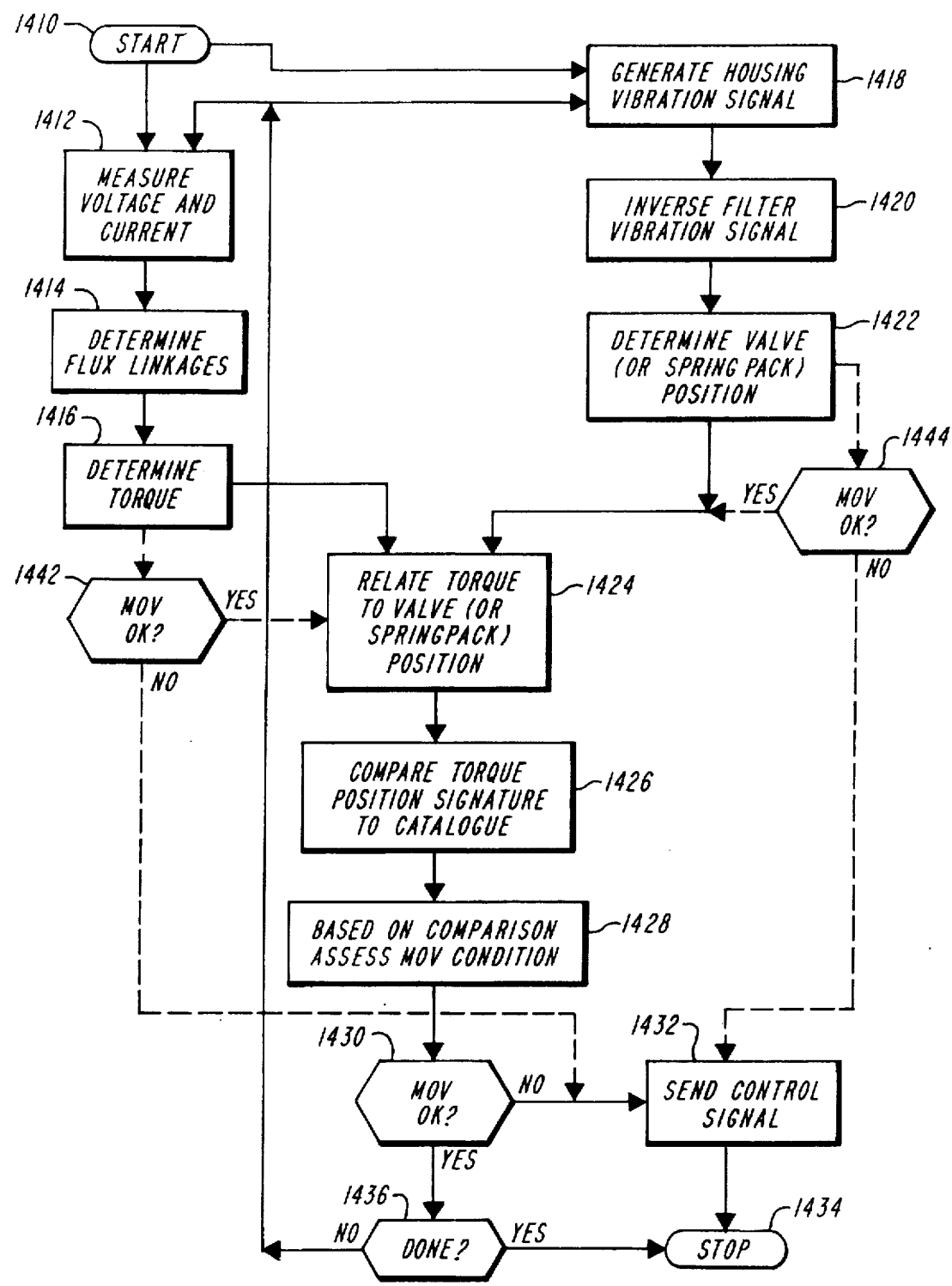
FIG. 14 shows schematically the steps of a general, preferred embodiment of the method of the invention for determining the motor torque, the position of the valve and the compression of the spring pack.

The general steps of the method aspects of the invention for assessing MOV condition, which have been discussed in connection with the apparatus, are shown in FIG. 14 schematically in flow chart form. The general method of assessing MOV condition starts 1410 and two parallel branches are followed: the torque branch and the valve position branch. These steps would typically be carried out substantially simultaneously.

The torque estimation branch conducts the same steps as would be conducted by a stand alone torque estimator, outlined above. The voltages and currents are measured 1412. Next, the flux linkages are determined 1414. They may be determined as discussed above, using a forgetting factor and error correction. Or, they may be determined using any other method. Finally, the torque is determined 1416 from the flux linkages and the measured voltage and current, as discussed above.

This method of estimating the torque is not the only method contemplated by the invention. Any method that can establish the torque between the stator and the rotor, which is not invasive, or otherwise disruptive of the normal operating condition of an MOV, is considered to be within the invention. Further, if any such other techniques are developed after the date hereof, use of such techniques in the general method described herein is also considered to be part of the invention.

Considering now the valve position branch, a housing vibration signal is generated 1418, for instance by an accelerometer attached to the housing. This signal is inverse filtered 1420, to arrive at the gear meshing signal. Next, the valve position is determined 1422. Alternatively, or in addition, the compression of the spring pack is also determined at this step 1422. This step of determining the valve position is set out in more detail in FIG. 15, discussed below.

As with determining the torque, the foregoing is not the only method of determining valve position (and spring pack compression) contemplated by the invention. Any method that can establish the valve position, which is not invasive, or otherwise disruptive of the normal operating condition of an MOV, is considered to be within the invention. Further, if any such other techniques are subsequently developed, use of such techniques in the general method described herein is also considered to be part of the invention.

The torque measurement can optionally be used alone to evaluate 1442 whether some aspects of the MOV operation are acceptable, to perform the same function as the torque switch. (These steps are shown in dotted line.) If operation is not acceptable, the method proceeds to send 1432 an appropriate control signal.

Similarly, the valve and spring pack position signals can optionally be used to evaluate 1444 whether other aspects of the MOV operation are acceptable, to perform the same function as the torque limit switch or the travel limit switch. (These optional steps are shown in dotted line.) If the operation is not acceptable, the method proceeds to send 1432 an appropriate control signal.

If the operating conditions as tested by the torque estimator and/or the vibration analyzer are acceptable, the method proceeds to compare the torque with the vibration information.

The method may also omit these two evaluation steps 1442 and 1444, and proceed directly to the torque and position relation step 1424, as indicated in the flow chart by the solid lines. The torque is related 1424 to the valve position (or the spring pack compression), typically through the common variable of time, to produce an MOV signature or profile curve, such as are shown in FIG. 1. The signature is compared 1426 to other signature curves. The comparison may be conducted by a human operator who visually compares the signature to one or more signatures that have been previously established and correlated with the MOV operating conditions they represent. Alternatively, the comparison may be conducted by an apparatus such as a computer that applies known curve matching techniques, to identify a suitably close match. The catalogue of signatures may be made up of signatures of the same MOV under examination, from prior tests, or signatures of similar valves. The signatures may also be wholly synthetic, having been generated from constitutive computer models.

Based on the comparison, the MOV condition is assessed 1428. A determination is made 1430 whether the MOV is in an acceptable operating condition. If it is not, a control signal is sent 1432. For instance, a signal may be sent to the MOV de-energizing the motor. Or, an alarm can be set off alerting the human operator, or to activate a companion MOV. A flag can be set to indicate that the MOV is in need of repair or inspection. Depending on the function of the MOV, other control signals may also be appropriate, as will be understood to those skilled in the art. After the control signal is sent, the process stops 1434.

If, at the assessment step 1430, it is determined that the MOV is in acceptable operating condition, the process considers 1436 whether the MOV operation cycle has finished. If it has, the process stops. If not, it returns to again follow the two paths of determining the torque and the valve position (or spring pack compression) for subsequent comparison.

Figure 15:
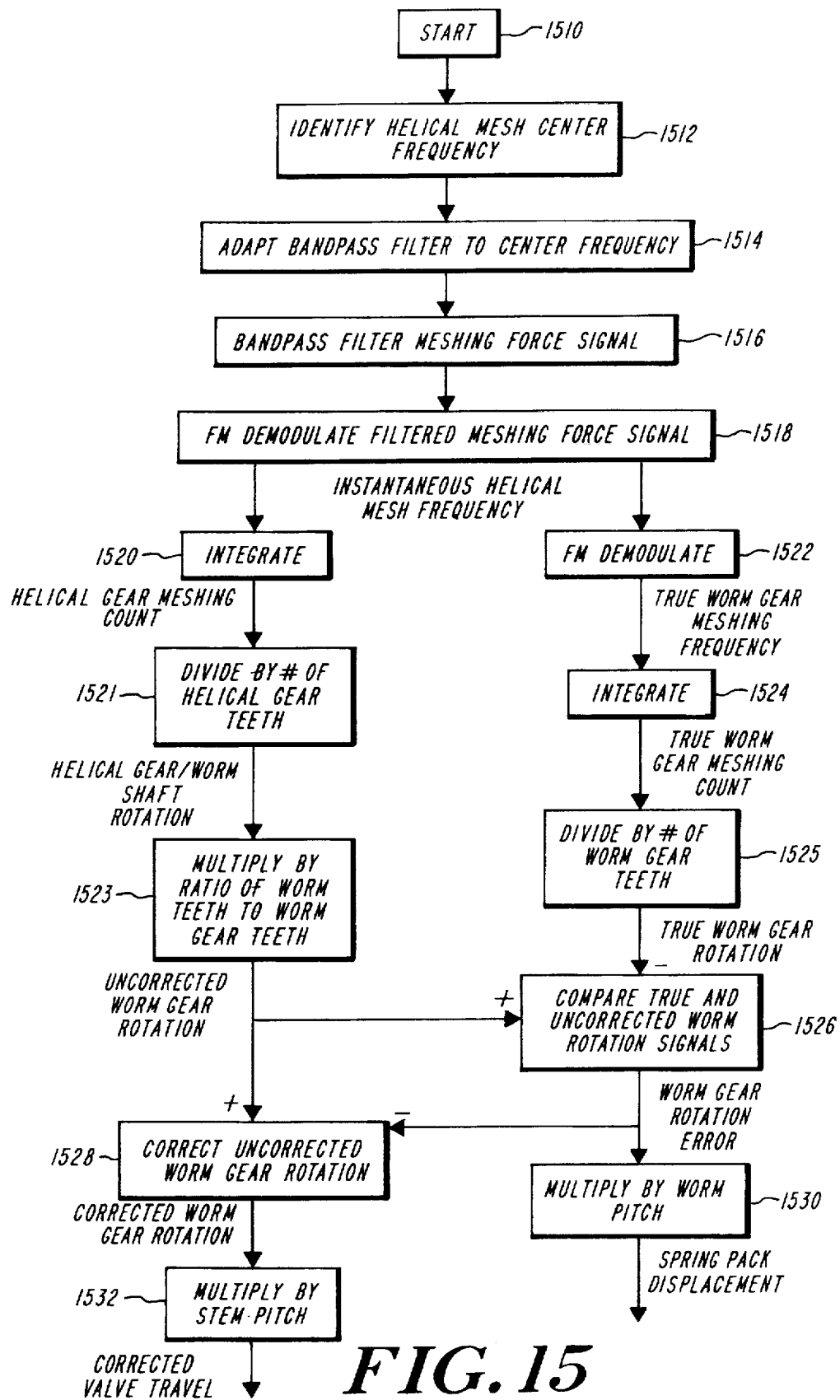
FIG. 15 shows schematically the detailed steps of a preferred embodiment of the method of the invention for determining the valve position and the spring pack compression (for instance as set forth at step 1422 in FIG. 14) from a vibration signal, for an MOV having at least two gear pairs.

A preferred embodiment of the method steps for determining 1422 the valve position and spring pack compression for use with an MOV having two gear pairs is shown in some detail with respect to the flow chart of FIG. 15. In the figure, the term "helical" is used to refer to one gear pair and the term "worm" is used to refer to a second gear pair. However, it is not meant in this case to limit the terms to the types of gears typically referred to by those words. It is only intended to identify two different gear pairs. The process starts 1510, followed by identification 1512 of the helical meshing center frequency. Next, a bandpass filter is adapted 1514 to the identified center frequency, after which the meshing force signal is bandpass filtered 1516. The filtered meshing force signal is FM demodulated 1518, resulting in an instantaneous helical meshing frequency signal.

This signal is treated in two parallel paths. In one path, (shown on the right in FIG. 15) the helical meshing frequency signal is FM demodulated 1522 again to generate an instantaneous worm gear meshing frequency signal. (According to one embodiment of the method of the invention, it may be determined whether the torque exceeds a threshold torque, $T_0$, above which the spline will be displaced from its rest position. If so, then this path is followed. If not, it is not followed, and the signal is treated only by the other parallel path, discussed below.)

The true worm gear meshing frequency signal is integrated 1524 over time to generate a true worm gear meshing count signal. This signal is divided 1525 by the number of worm gear teeth to generate a true worm gear rotation signal. This worm gear rotation signal is a "true" worm gear rotation signal, but it is relatively low resolution (as compared to the worm gear rotation signal determined only by analysis of the helical gear meshing), due to the frequency of the worm gear mesh.

Meanwhile, along the other path (on the left, as shown in FIG. 15), the demodulated instantaneous helical meshing frequency signal is integrated 1520 over time to generate a helical gear meshing count signal. This signal is divided 1521 by the number of helical gear teeth and then multiplied 1523 by the ratio of worm teeth to worm gear teeth to generate an "uncorrected" worm gear rotation signal. This signal is of a relatively high resolution, but is inaccurate because it does not take into account the sliding of the worm on the splined shaft. The signal would correspond to a "true" worm gear rotation if the worm gear and the helical gear were directly connected without any slip or lost motion. The difference between the low resolution, true worm gear rotation signal and the high resolution, uncorrected worm gear rotation signal, is due to the spring pack displacement.

The two rotation signals are compared 1526 to generate a worm gear rotation error signal. This signal is multiplied 1530 by the worm pitch to generate a spring pack displacement signal. This spring pack displacement signal can be used in its own right, to form the basis of MOV signatures, in conjunction with a torque signal, or it can be used as a substitute for the torque limit switch (if the signal processing required to generate it can be accomplished quickly enough.).

Once the worm gear rotation error signal is known, it can be used to correct 1528 the high resolution, uncorrected worm gear rotation signal by subtracting the error signal from the uncorrected signal, to generate a high resolution, corrected worm gear rotation signal. This corrected worm gear rotation signal is multiplied by the stem pitch 1532 to generate a valve travel signal.

Although the relatively low resolution worm gear signal is used indirectly to generate this valve travel signal, in part, because it is being used only for a portion of the signal, the resultant signal has a higher resolution and a better signal to noise resolution than it would if it were generated using only the true worm gear signal (from demodulating the helical gear rotation signal). In this manner, the valve travel signal and the spring pack displacement signals are generated.

It should be understood that the foregoing steps have been described above as being performed using certain techniques. However, if other techniques are made available, or determined to be suitable for certain situations of noise and gear meshing frequencies and configurations, their use is also contemplated as within the invention. For instance, the center frequency of the helical gear need not be identified 1512 using an AR spectral technique. The filtered meshing force signal can be demodulated 1518 in any appropriate way, and it need not be using the Wigner-Ville or Teager methods. The FM demodulation of the instantaneous pinion frequency need not be conducted using AR analysis.

The apparatus has been described above, particularly in connection with FIG. 4, contemplating dedicated modules for estimating torque, analyzing vibration, estimating position, system analysis, etc. Such a configuration is feasible and may be very useful in many situations. Another configuration uses a properly programmed general purpose digital computer. Such a configuration is shown schematically with respect to FIG. 16. The power source 432, housing 430, motor 204, gear train 208, valve 202, accelerometer 434 and voltage and current meters 434 and 436 are as shown in FIG. 4. An analog to digital convertor 1602 is connected to the three meters and converts their analog signals to digital signals. A suitable convertor should have enough channels to handle all of the signals to be analyzed. The A/D convertor provides appropriate signals to the CPU 1604 of a general purpose computer, such as an IBM PC compatible with a 80486 Intel processor, running under a UNIX operating system.

The CPU 1604 is typically programmed to perform the torque estimation, as well as the valve position determination principally as illustrated in FIGS. 13, 14 and 15. It may also be used to compare the signatures to one or more pre-recorded signatures. These may be kept in computer memory 1606, along with other information necessary for the CPU to perform the steps identified above. A user input/output interface 1608 enables the user to establish parameters, such as alarm thresholds, and to review the output of the apparatus, particularly the MOV signature for the run in question. A digital to analog convertor 1610 converts digital signals from the computer to analog signals that may be used to control the MOV, for instance a control signal to cut off power to the motor 204.

Other variations in the hardware will be evident to those skilled in the art. Some of the individual components shown in FIGS. 4 and 10A and 10B may be combined, with the functions of other components being performed by a computer, either general purpose, or more specialized microprocessor.

The invention can be used either in real time, as an MOV is operating, or as part of a routine maintenance program, where the signatures generated by the invention during routine maintenance tests are used to prioritize repair and replacement schedules. If to be used in real time, a set of representative fault signatures, such as shown at FIG. 1, would be generated, and compared to the developing signature of the valve under test, as the test progresses.

USE OF THE INVENTION IN CONJUNCTION WITH THE TORQUE LIMIT SWITCH

One of the most common MOV failures originates from inaccurate setting of the torque limit switch. Since the torque limit switch controls the valve thrust on the valve seat, an inaccurate setting can cause jamming of the valve or leakage of the flow. How to determine a proper torque limit switch setting is poorly understood. Furthermore, setting the torque limit switch is tricky because of problems in the mechanical implementation.

An additional benefit of this invention is that the mechanical implementation problems of the torque limit switch can be solved by using the torque estimator to directly control the motor. Then the torque estimator would provide motor disengagement accurately at the desired torque level.

The developed methods can also be used to check the torque limit switch level and calibrate the spring pack constant from the estimated torque and the estimated spring pack displacement.

Rather than using the torque estimator as a substitute for the torque limit switch, it is also possible to use the vibration analyzer for this purpose. Specifically, the vibration analyzer generates a signal that corresponds to the spring pack displacement. The spring pack displacement is directly related to the torque applied to the valve stem according to a relation based on the spring constant and the gear ratio. Thus, the apparatus of the vibration analyzer described above can be used to estimate the torque applied to the valve stem, and thus to determine whether a recommended torque threshold has been exceeded.

The foregoing discussion should be understood as illustrative and should not be considered to be limiting in any sense. While this invention has been particularly shown and described with references to preferred embodiments thereof, it will be understood by those skilled in the art that various changes in form and details may be made therein without departing from the spirit and scope of the invention as defined by the claims.

For instance, the general techniques can be used for any type of MOV, having one or more gear pairs, rather than the two shown. If one, only, it will not be necessary to perform analysis to determine the second gear meshing frequency. If more than two, it may be necessary to perform additional signal processing, using the general principals discussed. Any suitable type of demodulators can be used and any suitable means for determining the torque can be used. It may also be used with MOV arrangements with two or more gear pairs, with some lost motion mechanism other than a splined worm that operates to allow a drive ratio that is not direct, i.e. with some allowance for a torque that exceeds a threshold torque to be taken up by a spring element. The spring element need not be linear and can be rotary, torsional, hydraulic or any other similar device.

The vibration pickup 434 may be an accelerometer mechanically coupled to the operator housing, as explained. It may also be any other sort of device that can generate a signal that corresponds to the vibration of the housing. The device could be a laser pickup, which senses vibration based on variations in the amplitude of reflected light. Doppler laser pickups, based on variations in the phase of reflected light may also be used. Eddy current or capacitive vibrations pickups may also be used and are contemplated to be encompassed by the generic vibration pickup 434. In the case of the laser, eddy current and capacitive pickups, the coupling between the housing and the pickup is not mechanical, and they need not be physically touching the housing (or any element that is mechanically coupled to the housing). They may be spaced away from the housing. This may be advantageous in some situations, for instance where it is desirable to avoid having additional wires passing from a housing mounted accelerometer to a distant control unit. Using a laser pickup, it may be possible to have transmission of the housing vibration signal through a significant distance, without the use of any wires.

Having described the invention, what is claimed is:

1. An apparatus for generating a parametric signature signal that corresponds to an operational aspect of a motor operated valve (an "MOV"), the MOV having:

I. an electric motor, having input electrical connections, a stator, a rotor and an output shaft;

II. within a housing, a first gear pair having a first gear and a second gear, the first gear being coupled to said output shaft; and III. a valve plug that is coupled to the second gear and that is movable, relative to a valve seat, in response to rotation of the output shaft;

said signature signal generating apparatus comprising:

a. vibrationally coupled with said housing, a vibrations pickup arranged to generate an electromagnetic signal that corresponds to vibration of said housing (designated a "housing signal");

b. electromagnetically coupled with the output of said vibration pickup, a vibration analyzer, which generates a position signal that corresponds to an estimate of the position of at least one element of said MOV that is coupled to said first gear, with respect to time;

c. a torque estimator, which generates a signal that corresponds to an estimate of the torque between the stator and the rotor of said motor with respect to time (designated the "torque estimate signal"); and d. a system analyzer, coupled to the outputs of the torque estimator and the vibration analyzer, which system analyzer generates a signature signal that corresponds to the relation between the motor torque and the at least one MOV element position.

2. The apparatus of claim 1, said torque estimator comprising:

a. coupled to the electrical input of the motor, a voltage meter for generating a signal that corresponds to the motor input voltage;

b. coupled to the electrical input of the motor, a current meter for generating a signal that corresponds to the motor input current; and c. coupled with the outputs of both the voltage meter and the current meter, a torque signal processor, which generates said torque estimate signal.

3. The apparatus of claim 2, said torque signal processor comprising:

a. a flux linkage estimator, which generates a signal that corresponds to estimated motor flux linkage based on said signals corresponding to the motor input voltage and current; and b. coupled to said flux linkage estimator, a torque estimator, which generates said torque estimate signal based on signals comprising:

i. the estimated motor flux linkage signal; and ii. a signal that corresponds to a forgetting factor.

4. The apparatus of claim 3, said torque estimator generating said torque estimate signal further based on a signal that corresponds to a correction factor related to said forgetting factor.

5. The apparatus of claim 1, further comprising a failure analyzer, coupled to the output of said system analyzer, to compare said signature signal to at least one predetermined signature signals, which predetermined signals correspond to known operating conditions of an MOV.

6. The apparatus of claim 5, wherein said at least one MOV element comprises said valve plug, and said position comprises the position of said valve plug relative to said valve seat.

7. The apparatus of claim 1, said vibration analyzer comprising a first gear position estimator, which generates a signal that corresponds to an estimate of the rotational position of a gear of said first gear pair (designated the "first gear pair rotational position signal").

8. The apparatus of claim 7, said system analyzer comprising an MOV element position estimator that generates a signal that corresponds to an estimate of the position of said at least one MOV element based on said first gear pair rotational position signal.

9. The apparatus of claim 8, wherein said at least one MOV element comprises said valve plug, and said position comprises the position of said valve plug relative to said valve seat said signal corresponding to an estimate of the position of said valve plug designated the "valve plug position signal").

10. The apparatus of claim 8, said MOV further comprising:

I. a second gear pair, constituting a third gear and a fourth gear, the third gear being coupled through a lost motion element to said second gear which lost motion element includes a component that is movable if the torque between said third and fourth gears exceeds a threshold torque; and II. a spring, that is coupled between said housing and said third gear through said movable lost motion component, said spring being arranged to resist motion of said movable lost motion component;

wherein said at least one MOV element is said spring, said vibration analyzer further comprising a second gear position estimator, which generates a signal that corresponds to an estimate of the rotational position of the fourth gear (designated the "fourth gear rotational position signal") based on said first gear pair rotational position signal;

said system analyzer further comprising a spring displacement estimator, which generates a signal that corresponds to an estimate of the displacement of said spring (designated the "spring displacement signal") based on said fourth gear rotational position signal and said first gear rotational position signal.

11. The apparatus of claim 10, wherein said at least one MOV element is additionally said valve plug, and said system analyzer further comprises a valve plug position estimator, which generates a signal that corresponds to an estimate of the valve plug position relative to said valve seat, based on said first gear rotational position signal and said spring displacement signal.

12. The apparatus of claim 9, further comprising a control signal generator that generates a control signal based on said valve plug position signal.

13. The apparatus of claim 10, further comprising a control signal generator that generates a control signal based on said spring displacement signal.

14. The apparatus of claim 7, wherein said first gear position estimator comprises an FM demodulator.

15. The apparatus of claim 7 wherein said first gear position estimator comprises a band pass filter, that is adaptable to pass portions of a signal that correspond to vibration due to meshing of said first gear pair.

16. The apparatus of claim 14, wherein said FM demodulator comprises a Wigner-Ville demodulator.

17. The apparatus of claim 14, wherein said FM demodulator comprises a Teager demodulator.

18. The apparatus of claim 10, said second gear position estimator comprising an FM demodulator.

19. The apparatus of claim 18, said FM demodulator comprising an autoregressive demodulator.

20. The apparatus of claim 1, further comprising, located between said vibration pickup and said vibration analyzer, a housing effects filter that counters selected effects on said housing signal due to said housing signal having propagated from said first gear pair to said vibration pickup.

21. The apparatus of claim 14, said vibration analyzer further comprising, coupled to an output of said FM demodulator, an integrator, which generates a signal that corresponds to the number of gear meshings of said first gear pair, relative to time.

22. The apparatus of claim 18, said second gear position estimator further comprising, coupled to an output of said FM demodulator, an integrator, which generates a signal that corresponds to the number of gear meshings of said second gear pair.

23. The apparatus of claim 1, further comprising a control signal generator that generates a control signal based on said torque estimate signal.

24. The apparatus of claim 1, said vibration pickup comprising an accelerometer.

25. The apparatus of claim 1, said vibration pickup comprising a laser pickup.

26. An apparatus for generating a parametric signature signal that corresponds to an operational aspect of a motor operated valve (an "MOV"), the MOV having:
   I. an electric motor, having input electrical connections, a stator, a rotor and an output shaft;
   II. within a housing a first gear pair having a first gear and a second gear, the first gear being coupled to said output shaft; and
   III. a valve plug that is coupled to the second gear and that is movable, relative to a valve seat, in response to rotation of the output shaft;
said signature signal generating apparatus comprising:
   a. vibrationally coupled with said housing, a vibration pickup;
   b. electromagnetically coupled with the output of said vibration pickup, a vibration analyzer;
   c. a torque estimator; and
   d. a system analyzer, coupled to the outputs of the torque estimator and the vibration analyzer, which system analyzer generates a signature signal that corresponds to the relation between the motor torque and the position of at least one MOV element that is coupled to said first gear.

27. The apparatus of claim 26, said torque estimator comprising:
   a. coupled to the electrical input of the motor, a voltage meter;
   b. coupled to the electrical input of the motor, a current meter; and
   c. coupled with the outputs of both the voltage meter and the current meter, a torque signal processor, which generates a torque estimate signal.

28. The apparatus of claim 26, said torque signal processor comprising:
   a. a flux linkage estimator, which generates a signal that corresponds to estimated motor flux linkage based on signals corresponding to the motor input voltage and current; and
   b. coupled to said flux linkage estimator, a torque estimator, which generates said torque estimate signal based on signals comprising:
      i. the estimated motor flux linkage signal; and
      ii. a signal that corresponds to a forgetting factor.

29. The apparatus of claim 28, said torque estimator generating said torque estimate signal further based on a signal that corresponds to a correction factor related to said forgetting factor.

30. The apparatus of claim 26, further comprising a failure analyzer, coupled to the output of said system analyzer, to compare said signature signal to at least one predetermined signature signals, which predetermined signals correspond to known operating conditions of an MOV.

31. The apparatus of claim 26, wherein said at least one MOV element comprises said valve plug, and said position comprises the position of said valve plug relative to said valve seat.

32. The apparatus of claim 26, said vibration analyzer comprising a first gear position estimator.

33. The apparatus of claim 32, said system analyzer comprising an MOV element position estimator.

34. The apparatus of claim 33, wherein said at least one MOV element comprises said valve plug, and said position comprises the position of said valve plug relative to said valve seat.

35. The apparatus of claim 33, said MOV further comprising:
   I. a second gear pair, constituting a third gear and a fourth gear, the third gear being coupled through a lost motion element to said second gear which lost motion element includes a component that is movable if the torque between said third and fourth gears exceeds a threshold torque; and
   II. a spring, that is coupled between said housing and said third gear through said movable lost motion component, said spring being arranged to resist motion of said movable lost motion component;
   wherein said at least one MOV element is said spring, said vibration analyzer further comprising a second gear position estimator; and
   wherein said MOV element position estimator comprises a spring displacement estimator.

36. The apparatus of claim 35, wherein said at least one MOV element is additionally said valve plug, and said MOV element position estimator further comprises a valve plug position estimator.

37. The apparatus of claim 34, further comprising a control signal generator that generates a control signal based on the position of said valve plug.

38. The apparatus of claim 35, further comprising a control signal generator that generates a control signal based on the displacement of said spring.

39. The apparatus of claim 32, wherein said first gear position estimator comprises an FM demodulator.

40. The apparatus of claim 32 wherein said first gear position estimator comprises a band pass filter, that is adaptable to pass portions of a signal that correspond to vibration due to meshing of said first gear pair.

41. The apparatus of claim 39, wherein said FM demodulator comprises a Wigner-Ville demodulator.

42. The apparatus of claim 39, wherein said FM demodulator comprises a Teager demodulator.

43. The apparatus of claim 35, said second gear position estimator comprising an FM demodulator.

44. The apparatus of claim 43, said FM demodulator comprising an autoregressive demodulator.

45. The apparatus of claim 26, further comprising, located between said vibration pickup and said vibration analyzer, a housing effects filter that counters selected effects on vibrational housing signals reaching said vibration pickup due to said vibrational housing signals having propagated from said first gear pair to said vibration pickup.

46. The apparatus of claim 39, said vibration analyzer further comprising, coupled to an output of said FM demodulator, an integrator.

47. The apparatus of claim 43, said second gear position estimator further comprising, coupled to an output of said FM demodulator, an integrator.

48. The apparatus of claim 26, further comprising a control signal generator that generates a control signal based on a signal generated by said torque estimator.

49. The apparatus of claim 26, said vibration pickup comprising an accelerometer.

50. The apparatus of claim 26, said vibration pickup comprising a laser pickup.

51. The apparatus of claim 1, said first gear comprising a pinion gear and said second gear comprising a helical gear.

52. The apparatus of claim 10, said third gear comprising a worm and said fourth gear comprising a worm gear.

53. The apparatus of claim 10, said lost motion element comprising a splined shaft coupled to a worm.

54. An apparatus for generating a parametric signature signal that corresponds to an operational aspect of a motor operated valve (an "MOV"), the MOV having:

I. an electric motor, having input electrical connections, a stator, a rotor and an output shaft;

II. within a housing, first gear pair having a first gear and a second gear, the first gear being coupled to said output shaft; and III. a valve plug that is coupled to the second gear and that is movable, relative to a valve seat, in response to rotation of the output shaft;

said signature signal generating apparatus comprising:

a. vibrationally coupled with said housing, a vibration pickup arranged to generate an electromagnetic signal that corresponds to vibration of said housing (designated a "housing signal"); and b. electromagnetically coupled with the output of said vibration pickup, a vibration analyzer, which generates a position signal that corresponds to an estimate of the position of at least one element of said MOV that is coupled to said first gear, with respect to time.

55. The apparatus of claim 54, further comprising a failure analyzer, coupled to the output of said system analyzer, to compare said signature signal to at least one predetermined signature signals, which predetermined signals correspond to known operating conditions of an MOV.

56. The apparatus of claim 55, wherein said at least one MOV element comprises said valve plug, and said position comprises the position of said valve plug relative to said valve seat.

57. The apparatus of claim 54, said vibration analyzer comprising a first gear position estimator, which generates a signal that corresponds to an estimate of the rotational position of a gear of said first gear pair (designated the "first gear pair rotational position signal").

58. The apparatus of claim 57, wherein said at least one MOV element comprises said valve plug, and said position of at least one element comprises the position of said valve plug relative to said valve seat, said signal corresponding to an estimate of the position of said valve plug designated the "valve plug position signal").

59. The apparatus of claim 57, said MOV further comprising:

I. a second gear pair, constituting a third gear and a fourth gear, the third gear being coupled through a lost motion element to said second gear, which lost motion element includes a component that is movable if the torque between said third and fourth gears exceeds a threshold torque; and II. a spring, that is coupled between said housing and said third gear through said movable lost motion, said spring being arranged to resist motion of said movable lost motion component;

wherein said MOV element is said spring, said vibration analyzer further comprising a second gear position estimator, which generates a signal that corresponds to an estimate of the rotational position of the fourth gear (designated the "fourth gear rotational position signal") based on said first gear pair rotational position signal;

said apparatus further comprising a spring displacement estimator, which generates a signal that corresponds to an estimate of the displacement of said spring (designated the "spring displacement signal") based on said fourth gear rotational position signal and said first gear rotational position signal.

60. The apparatus of claim 59, wherein said at least one MOV element is additionally said valve plug, and said system analyzer further comprises a valve plug position estimator, which generates a signal that corresponds to an estimate of the valve plug position relative to said valve seat, based on said first gear rotational position signal and said spring displacement signal.

61. The apparatus of claim 58, further comprising a control signal generator that generates a control signal based on said valve plug position signal.

62. The apparatus of claim 59, further comprising a control signal generator that generates a control signal based on said spring displacement signal.

63. The apparatus of claim 57, wherein said first gear position estimator comprises an FM demodulator.

64. The apparatus of claim 54, further comprising, located between said accelerometer and said vibration analyzer, a housing effects filter that counters selected effects on said housing signal due to said housing signal having propagated from said first gear pair to said vibration pickup.

65. An apparatus for generating a signal that corresponds to an estimate of the torque between the stator and rotor of a motor said apparatus comprising:

a. coupled to the electrical input of the motor, a voltage meter for generating a signal that corresponds to the motor input voltage;

b. coupled to the electrical input of the motor, a current meter for generating a signal that corresponds to the motor input current; and c. coupled with the outputs of both the voltage meter and the current meter, a torque signal processor, which generates said torque estimate signal, said torque signal, processor comprising:

i. a flux linkage estimator, which generates a signal that corresponds to estimated motor flux linkage based on said signals corresponding to the motor input voltage and current; and ii. coupled to said flux linkage estimator, a torque estimator, which generates said torque estimate signal based on signals comprising:

(a). the estimated motor flux linkage signal;

(b). a signal that corresponds to a forgetting factor; and (c). a correction factor signal related to said forgetting factor.

66. The apparatus of claim 65, further comprising a control signal generator that generates a control signal based on said torque estimate signal.

67. A method for identifying an operational aspect of a motor operated valve (an "MOV"), the MOV having:

I. an electric motor, having input electrical connections, a stator, a rotor and an output shaft;

II. within a housing, a first gear pair having a first gear and a second gear, the first gear being coupled to said output shaft; and III. a valve plug that is coupled to the second gear and that is movable, relative to a valve seat, in response to rotation of the output shaft;

said signature signal generating method comprising the steps of:

a. generating an electromagnetic signal that corresponds to vibration of said housing (designated a "housing signal");

b. generating a position signal that corresponds to an estimate of the position of at least one element of said MOV that is coupled to said first gear, with respect to time;

c. generating a signal that corresponds to an estimate of the torque between the stator and the rotor of said motor with respect to time (designated the "torque estimate signal"); and d. generating a signature signal that corresponds to the relation between the motor torque and the at least one MOV element position.

68. The method of claim 67, said step of generating the torque estimate signal comprising the steps of:

a. generating a signal that corresponds to the motor input voltage;

b. generating a signal that corresponds to the motor input current; and c. based on the outputs of both the voltage meter and the current meter, generating said torque estimate signal.

69. The method of claim 68, said step of generating said torque estimate signal comprising the steps of:

a. generating a signal that corresponds to estimated motor flux linkage based on said signals corresponding to the motor input voltage and current; and b. generating said torque estimate signal based on signals comprising:

i. the estimated motor flux linkage signal; and ii. a signal that corresponds to a forgetting factor.

70. The method of claim 69, said step of generating said torque estimate signal further comprising the step of applying a correction factor related to said forgetting factor.

71. The method of claim 67, further comprising the step of comparing said signature signal to at least one predetermined signature signals, which predetermined signals correspond to known operating conditions of an MOV.

72. A method for generating a parametric signature signal that corresponds to an operational aspect of a motor operated valve (an "MOV"), the MOV having:

I. an electric motor, having input electrical connections, a stator, a rotor and an output shaft;

II. within a housing, a first gear pair having a first gear and a second gear, the first gear being coupled to said output shaft; and III. a valve plug that is coupled to the second gear and that is movable, relative to a valve seat, in response to rotation of the output shaft;

said signature signal generating method comprising the steps of:

a. generating an electromagnetic signal that corresponds to vibration of said housing (designated a "housing signal"); and b. based on said housing signal, generating a position signal that corresponds to an estimate of the position of at least one element of said MOV that is coupled to said first gear, with respect to time.

73. The method of claim 72, further comprising the step of comparing said signature signal to at least one predetermined signature signals, which predetermined signals correspond to known operating conditions of an MOV.

74. The method of claim 73, wherein said at least one MOV element comprises said valve plug, and said position comprises the position of said valve plug relative to said valve seat.

75. The method of claim 72, said step of generating a position signal comprising the step of generating a signal that corresponds to an estimate of the rotational position of a gear of said first gear pair (designated the "first gear pair rotational position signal").

76. The method of claim 75, said step of generating a position signal further comprising the step of generating a signal that corresponds to an estimate of the position of said at least one MOV element based on said first gear pair rotational position signal.

77. The method of claim 76, wherein said at least one MOV element comprises said valve plug, and said position comprises the position of said valve plug relative to said valve seat, said signal corresponding to an estimate of the position of said valve plug designated the "valve plug position signal").

78. The method of claim 76, said MOV further comprising:

I. a second gear pair, constituting a third gear and a fourth gear, the third gear being coupled through a lost motion element to said second gear, which lost motion element includes a component that is movable if the torque between said third and fourth gears exceeds a threshold torque; and II. a spring, that is coupled between said housing and said third gear through said movable lost motion, said spring being arranged to resist motion of said movable lost motion component;

wherein said MOV element is said spring, said step of generating an MOV element position signal comprising the steps of:

a. generating a signal that corresponds to an estimate of the rotational position of the fourth gear (designated the "fourth gear rotational position signal") based on said first gear pair rotational position signal; and b. generating a signal that corresponds to an estimate of the displacement of said spring (designated the "spring displacement signal") based on said fourth gear rotational position signal and said first gear rotational position signal.

79. A method for generating a signal that corresponds to an estimate of the torque between the stator and rotor of a motor said method comprising the steps of:

a. generating a signal that corresponds to the motor input voltage;
b. generating a signal that corresponds to the motor input current; and
c. generating a signal that corresponds to estimated motor flux linkage based on said signals corresponding to the motor input voltage and current; and
d. generating said torque estimate signal based on signals comprising:

i. the estimated motor flux linkage signal;
ii. a signal that corresponds to a forgetting factor; and
iii. a correction factor signal related to said forgetting factor.

80. The method of claim 79, further comprising the step of generating a control signal based on said torque estimate signal.

* * * * *